US010522973B2

(12) United States Patent
Burroughs et al.

(10) Patent No.: US 10,522,973 B2
(45) Date of Patent: Dec. 31, 2019

(54) BEAM SHAPING FOR ULTRA-SMALL VERTICAL CAVITY SURFACE EMITTING LASER (VCSEL) ARRAYS

(71) Applicant: Sense Photonics, Inc., Durham, NC (US)

(72) Inventors: Scott Burroughs, Raleigh, NC (US); Brent Fisher, Bethesda, MD (US); James Carter, Chapel Hill, NC (US); Russell Kanjorski, Chapel Hill, NC (US)

(73) Assignee: Sense Photonics, Inc., Durham, NC (US)

( * ) Notice: Subject to any disclaimer, the term of this patent is extended or adjusted under 35 U.S.C. 154(b) by 0 days.

(21) Appl. No.: 15/951,760

(22) Filed: Apr. 12, 2018

(65) Prior Publication Data

US 2018/0301874 A1    Oct. 18, 2018

Related U.S. Application Data

(60) Provisional application No. 62/613,985, filed on Jan. 5, 2018, provisional application No. 62/484,701, filed on Apr. 12, 2017.

(51) Int. Cl.
*H01S 5/40* (2006.01)
*H01S 5/183* (2006.01)
(Continued)

(52) U.S. Cl.
CPC .......... *H01S 5/18397* (2013.01); *F21V 5/041* (2013.01); *F21V 5/045* (2013.01);
(Continued)

(58) Field of Classification Search
CPC .... G01S 17/89; H01S 5/18394; H01S 5/4018; H01S 5/4025; H01S 5/4031;
(Continued)

(56) References Cited

U.S. PATENT DOCUMENTS 5,909,296 A    6/1999  Tsacoyeanes
6,246,708 B1   6/2001  Thornton et al.
(Continued)

FOREIGN PATENT DOCUMENTS

JP    2005-158922    6/2005
JP    2009-095463    5/2009
(Continued)

OTHER PUBLICATIONS

Kang et al. "Compliant, Heterogeneously Integrated GaAs Micro-VCSELS towards Wearable and Implantable Integrated Optoelectronics Platforms" Advanced Optical Materials (33 pages) (2014).
(Continued)

*Primary Examiner* — Michael Carter
(74) *Attorney, Agent, or Firm* — Myers Bigel, P.A.

(57) ABSTRACT

A laser array includes a plurality of laser diodes arranged and electrically connected to one another on a surface of a non-native substrate. Respective laser diodes of the plurality of laser diodes have different orientations relative to one another on the surface of the non-native substrate. The respective laser diodes are configured to provide coherent light emission in different directions, and the laser array is configured to emit an incoherent output beam comprising the coherent light emission from the respective laser diodes. The output beam may include incoherent light having a non-uniform intensity distribution over a field of view of the laser array. Related devices and fabrication methods are also discussed.

19 Claims, 25 Drawing Sheets

(51) Int. Cl.
| | |
|---|---|
| *H01S 5/30* | (2006.01) |
| *H01S 5/00* | (2006.01) |
| *H01S 5/026* | (2006.01) |
| *F21V 5/04* | (2006.01) |
| *H01S 5/022* | (2006.01) |
| *G02B 26/10* | (2006.01) |
| *H01S 5/062* | (2006.01) |
| *H01S 5/42* | (2006.01) |
| *G01J 1/44* | (2006.01) |
| *H01L 31/167* | (2006.01) |
| *H01L 31/18* | (2006.01) |
| *G02B 5/08* | (2006.01) |
| *H01L 25/00* | (2006.01) |
| *H01S 3/02* | (2006.01) |
| *G01S 17/89* | (2006.01) |
| *G02B 3/00* | (2006.01) |
| *H01S 5/02* | (2006.01) |
| *H01S 5/12* | (2006.01) |

(52) U.S. Cl.
CPC ............... *G01J 1/44* (2013.01); *G01S 17/89* (2013.01); *G02B 5/0883* (2013.01); *G02B 26/10* (2013.01); *H01L 25/50* (2013.01); *H01L 31/167* (2013.01); *H01L 31/18* (2013.01); *H01S 3/025* (2013.01); *H01S 5/0028* (2013.01); *H01S 5/0071* (2013.01); *H01S 5/026* (2013.01); *H01S 5/0262* (2013.01); *H01S 5/02288* (2013.01); *H01S 5/062* (2013.01); *H01S 5/183* (2013.01); *H01S 5/18394* (2013.01); *H01S 5/30* (2013.01); *H01S 5/40* (2013.01); *H01S 5/4025* (2013.01); *H01S 5/4037* (2013.01); *H01S 5/4075* (2013.01); *H01S 5/423* (2013.01); *G01J 2001/448* (2013.01); *G02B 3/0006* (2013.01); *H01S 5/0216* (2013.01); *H01S 5/0217* (2013.01); *H01S 5/02292* (2013.01); *H01S 5/12* (2013.01)

(58) Field of Classification Search
CPC ...... H01S 5/4043; H01S 5/405; H01S 5/4056; H01S 5/4087; H01S 5/4093; H01S 5/42; H01S 5/4293; H01S 5/423; H01S 5/426
See application file for complete search history.

(56) References Cited

U.S. PATENT DOCUMENTS

| | | | |
|---|---|---|---|
| 7,544,945 B2 | 6/2009 | Tan et al. | |
| 9,126,034 B1 | 9/2015 | Deroberts | |
| 9,484,495 B2 | 11/2016 | Padullaparthi | |
| 2003/0185268 A1 | 10/2003 | Zhang | |
| 2012/0033692 A1 | 2/2012 | Schleuning et al. | |
| 2015/0010271 A1* | 1/2015 | Fattal | H01L 31/02327 385/14 |
| 2015/0071320 A1* | 3/2015 | Gronenborn | H01S 5/423 372/50.124 |
| 2015/0219764 A1* | 8/2015 | Lipson | H01S 5/00 356/4.01 |
| 2015/0260830 A1* | 9/2015 | Ghosh | G01S 7/484 250/208.1 |
| 2015/0308671 A1* | 10/2015 | Tischler | H01S 5/042 362/235 |
| 2016/0141839 A1 | 5/2016 | Matsubara et al. | |
| 2016/0156157 A1* | 6/2016 | Matsubara | H01S 5/0042 372/50.11 |

FOREIGN PATENT DOCUMENTS

| | | |
|---|---|---|
| KR | 10-2003-0038072 | 5/2003 |
| KR | 10-2012-0131821 | 12/2012 |
| WO | 2011/011291 | 1/2011 |

OTHER PUBLICATIONS

Kim et al. "GaN microcavity structure with dielectric distributed Bragg reflectors fabricated by using a wet-chemical etching of a (111) Si substrate" Applied Physics Letters 89(4):041129 (2006).

Liu, Yue "Heterogeneous Integration of OE Arrays With Si Electronics and Microoptics" IEEE Transactions on Advanced Packaging 25(1):43-49 (2002).

Muller et al. "1550-nm High-Speed Short-Cavity VCSELs" IEEE Journal of Selected Topics in Quantum Electronics 17(5)1158-1166 (2011).

Notification of Transmittal of the International Search Report and the Written Opinion of the International Searching Authority, or the Declaration, in corresponding PCT Application No. PCT/US2018/027298 (14 pages) (dated Aug. 8, 2018).

* cited by examiner

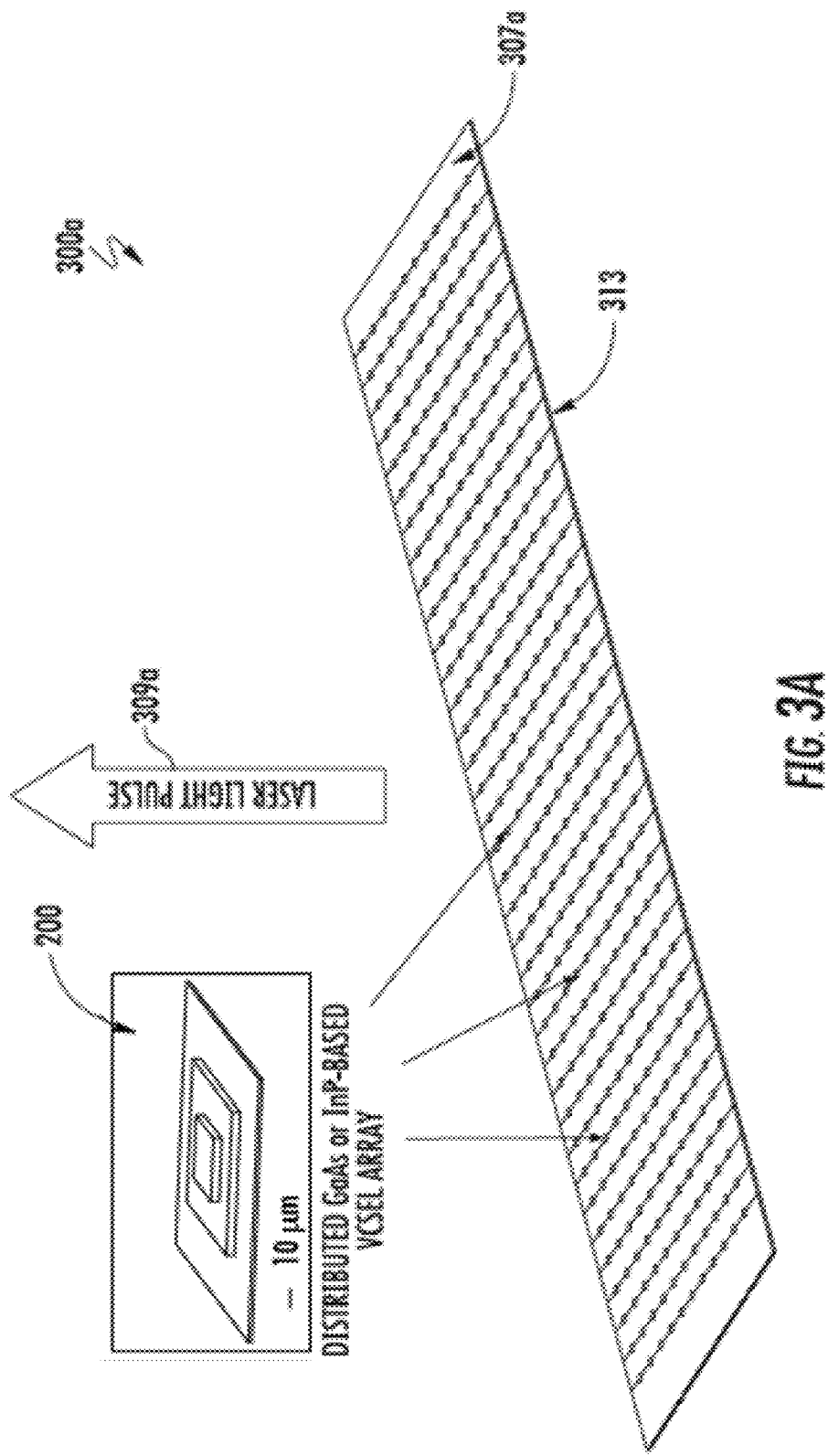

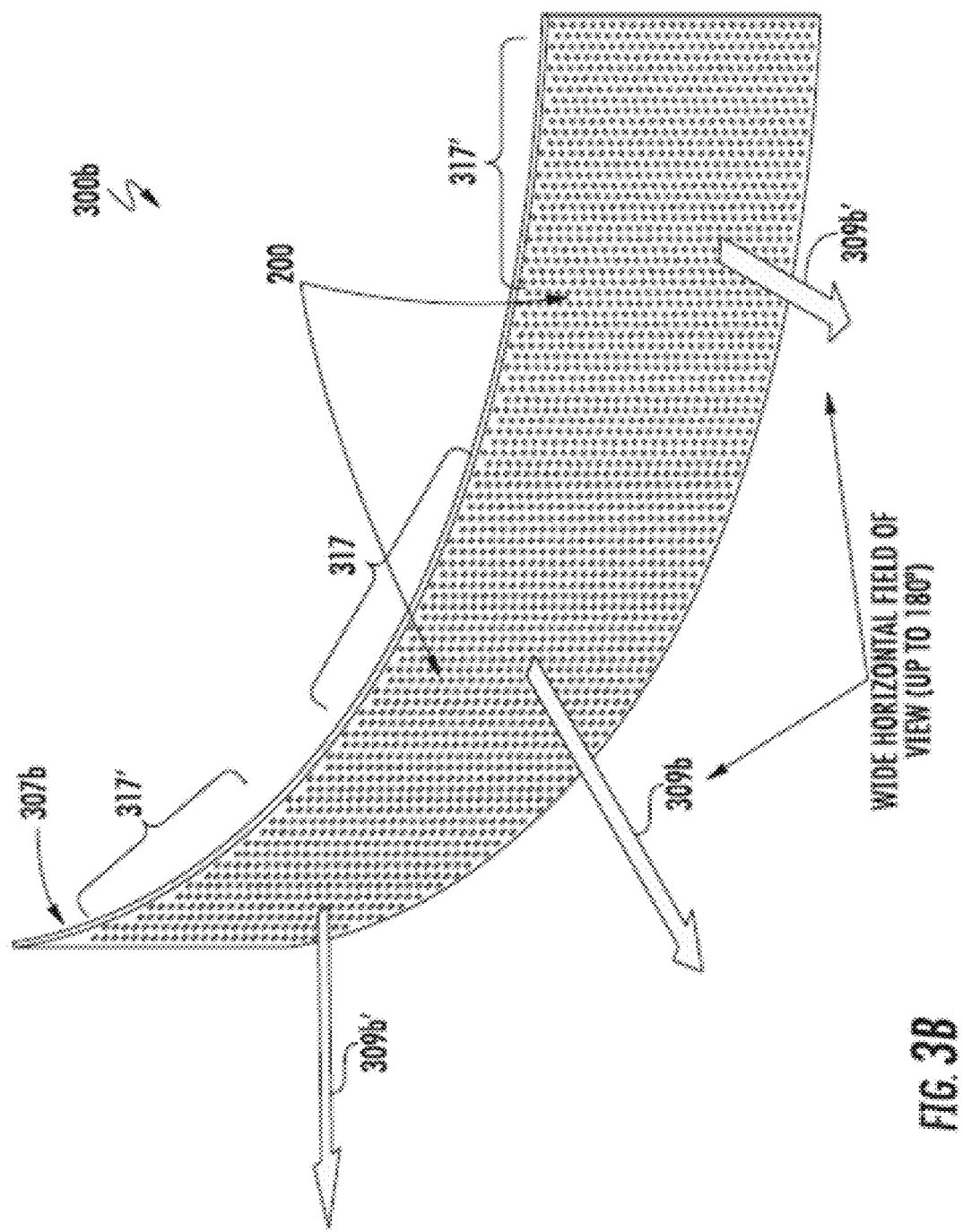

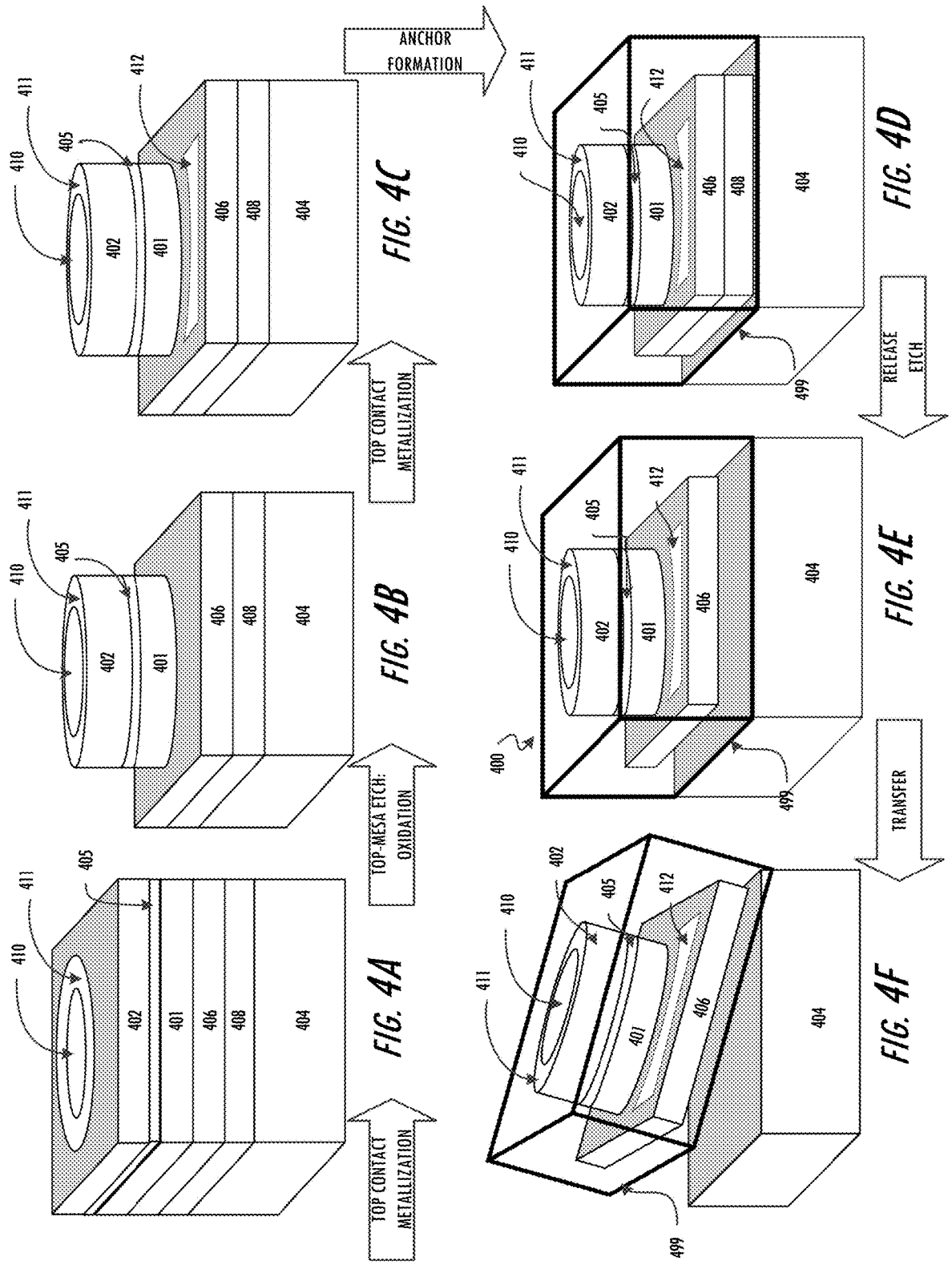

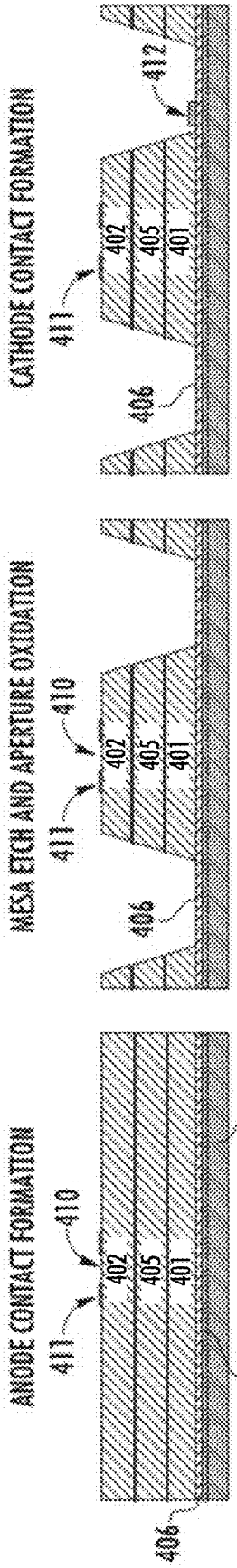
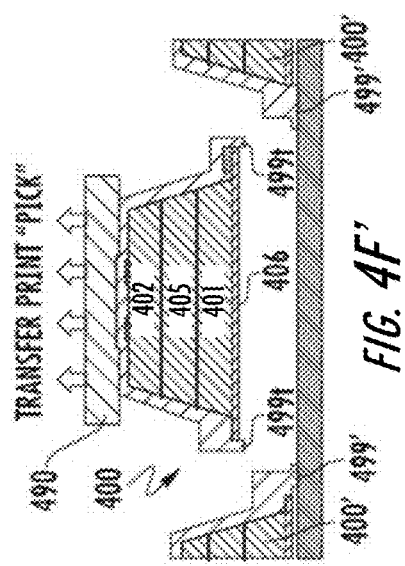
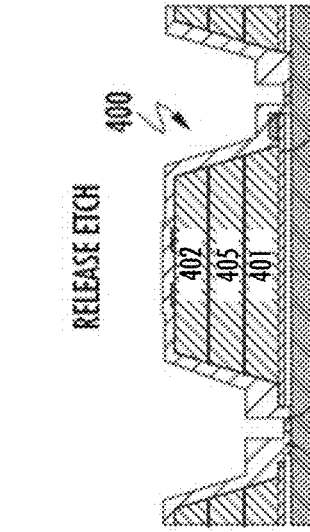
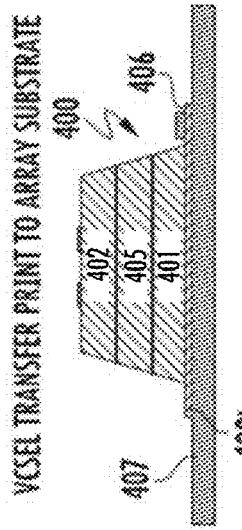
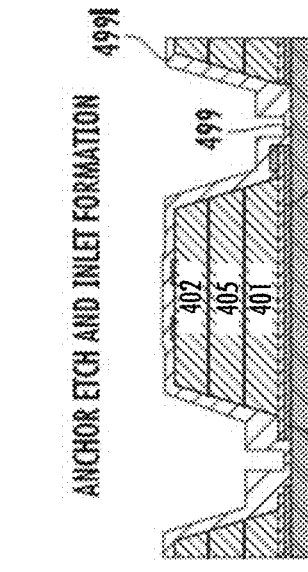
FIG. 4A' — ANODE CONTACT FORMATION
FIG. 4B' — MESA ETCH AND APERTURE OXIDATION
FIG. 4C' — CATHODE CONTACT FORMATION
FIG. 4D' — ANCHOR ETCH AND INLET FORMATION
FIG. 4E' — RELEASE ETCH
FIG. 4F' — TRANSFER PRINT "PICK"
FIG. 4G' — VCSEL TRANSFER PRINT TO ARRAY SUBSTRATE

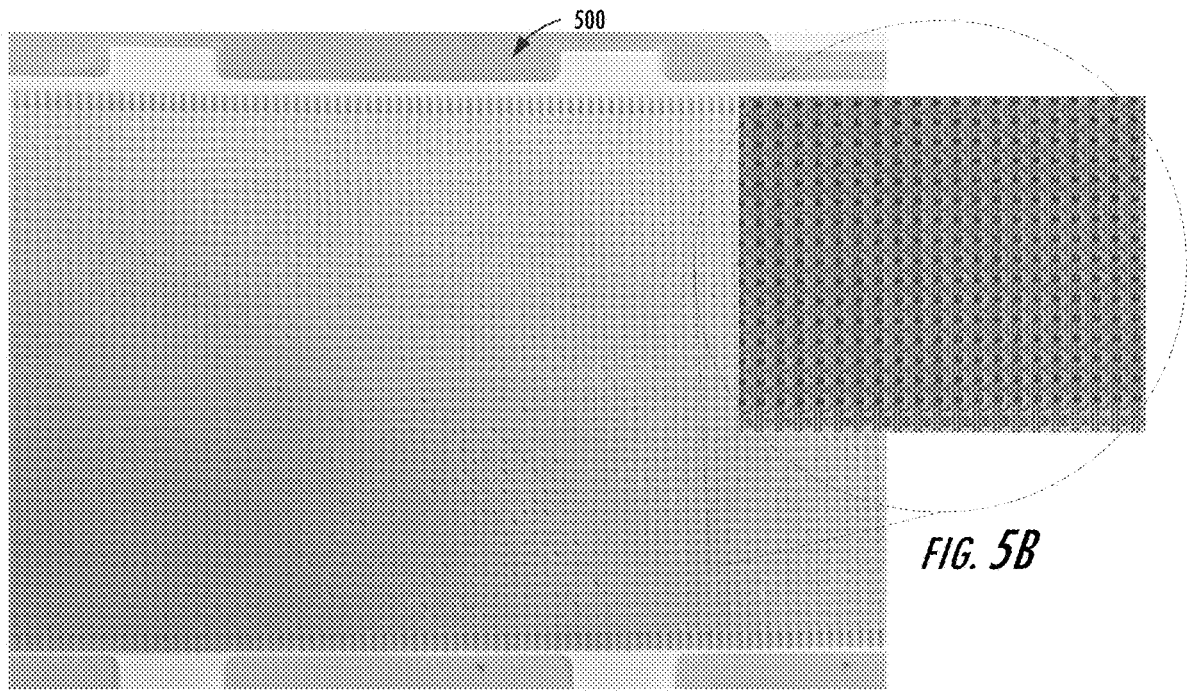
FIG. 5A
FIG. 5B
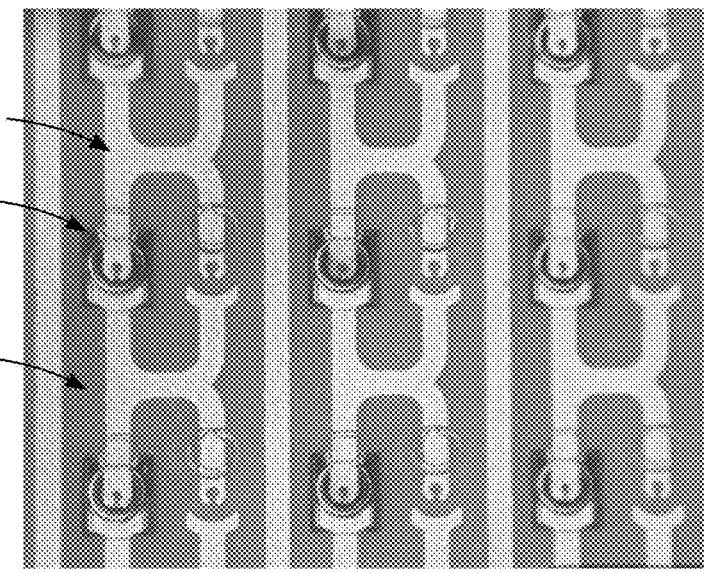
FIG. 5C

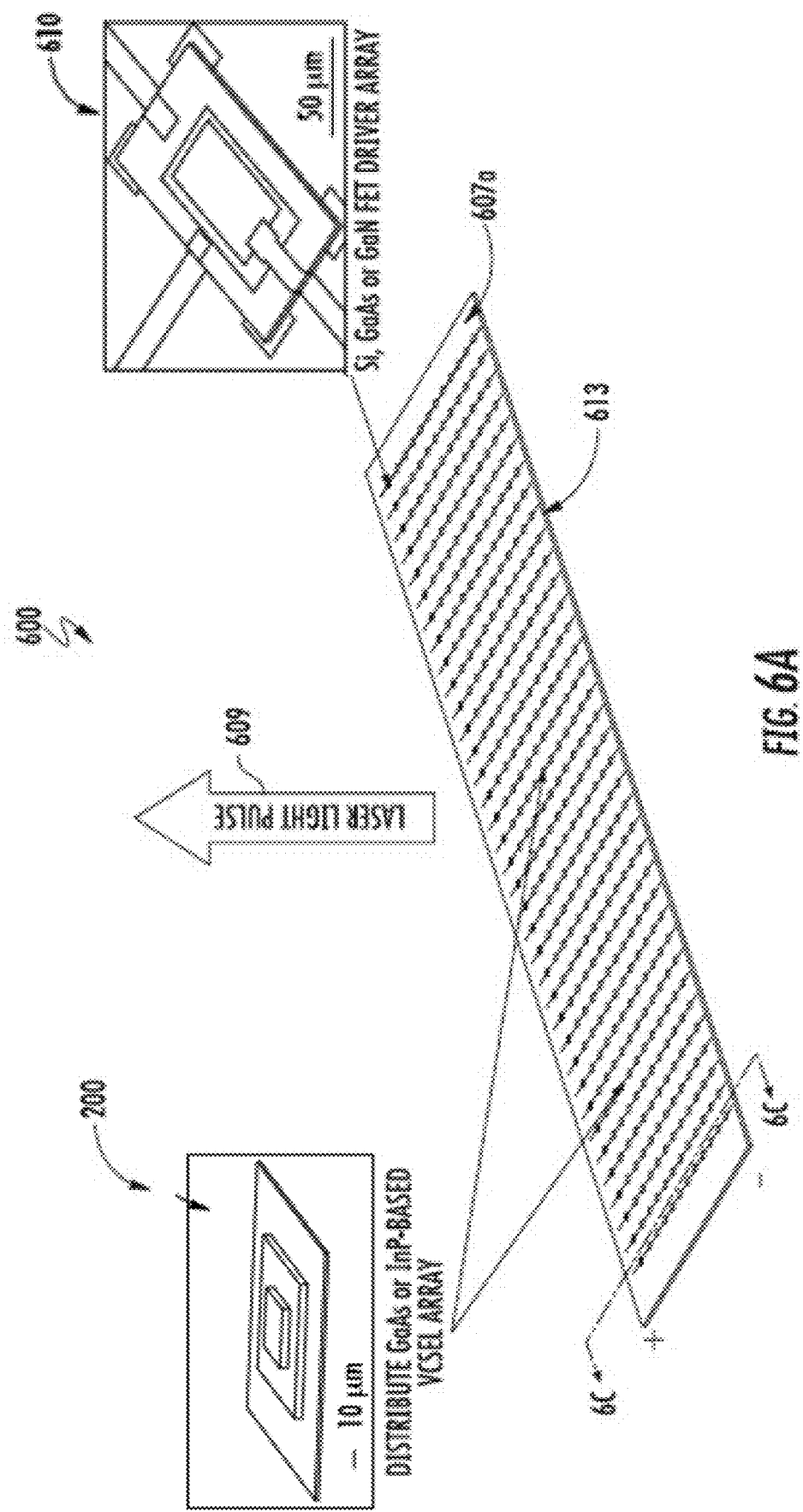

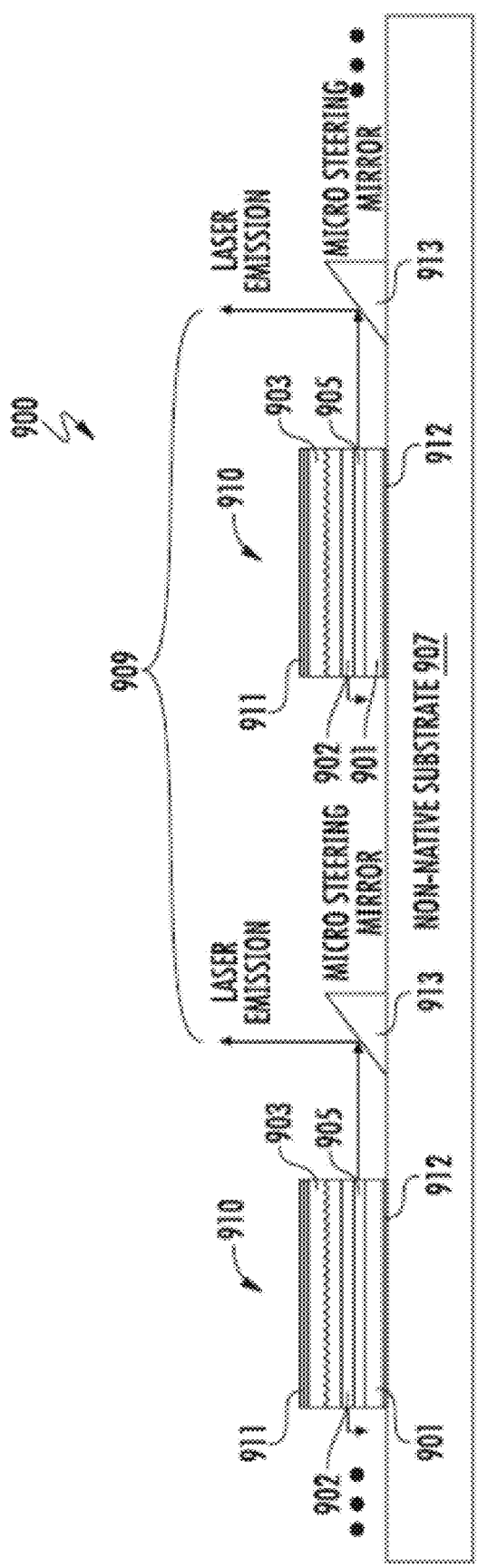

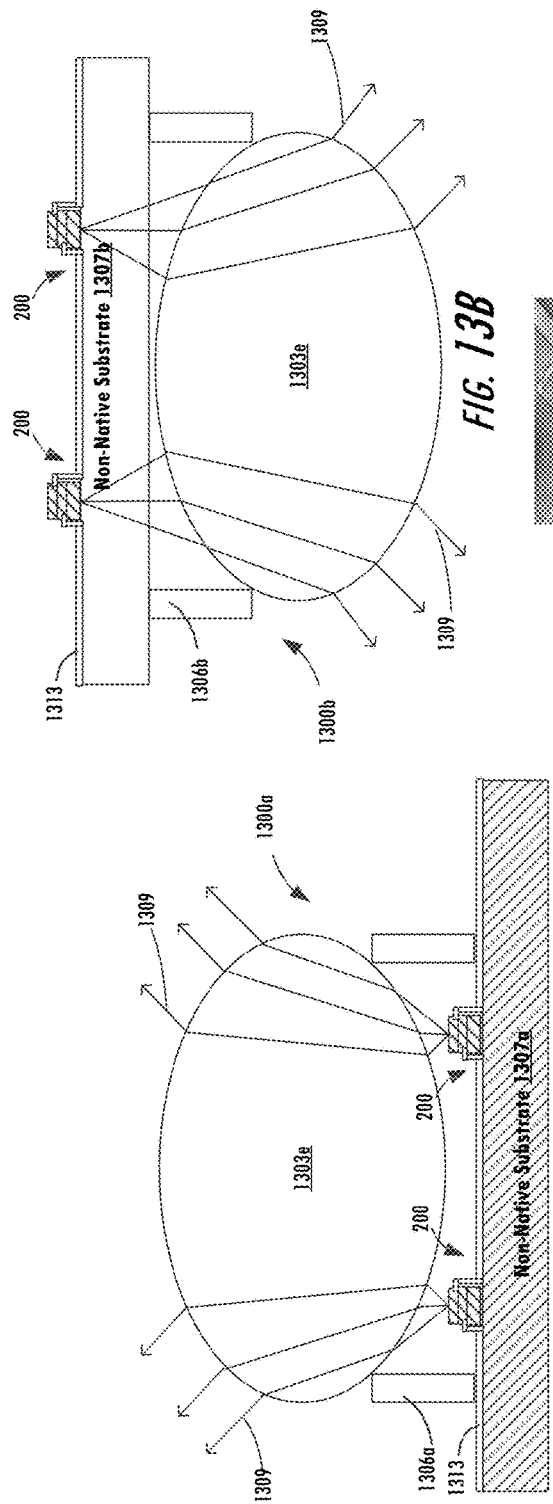
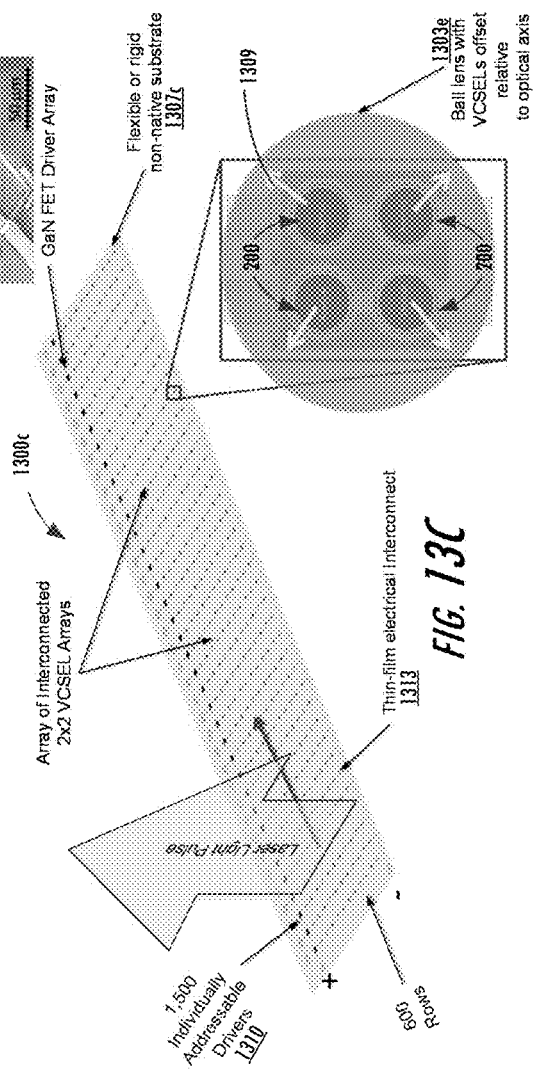
FIG. 13A
FIG. 13B
FIG. 13C

BEAM SHAPING FOR ULTRA-SMALL VERTICAL CAVITY SURFACE EMITTING LASER (VCSEL) ARRAYS

CLAIM OF PRIORITY

This application claims priority from U.S. Provisional Patent Application No. 62/484,701 entitled "LIGHT DETECTION AND RANGING (LIDAR) DEVICES AND METHODS OF FABRICATING THE SAME" filed Apr. 12, 2017, and U.S. Provisional Patent Application No. 62/613,985 entitled "ULTRA-SMALL VERTICAL CAVITY SURFACE EMITTING LASER (VCSEL) AND ARRAYS INCORPORATING THE SAME" filed Jan. 5, 2018, with the United States Patent and Trademark Office, the disclosures of which are incorporated by reference herein.

FIELD

The present invention relates to semiconductor-based lasers and related devices and methods of operation.

BACKGROUND

Many emerging technologies, such as Internet-of-Things (IoT) and autonomous navigation, may involve detection and measurement of distance to objects in three-dimensional (3D) space. For example, automobiles that are capable of autonomous driving may require 3D detection and recognition for basic operation, as well as to meet safety requirements. 3D detection and recognition may also be needed for indoor navigation, for example, by industrial or household robots or toys.

Light based 3D measurements may be superior to radar (low angular accuracy, bulky) or ultra-sound (very low accuracy) in some instances. For example, a light-based 3D sensor system may include a detector (such as a photodiode or camera) and a light emitting device (such as a light emitting diode (LED) or laser diode) as light source, which typically emits light outside of the visible wavelength range. A vertical cavity surface emitting laser (VCSEL) is one type of light emitting device that may be used in light-based sensors for measurement of distance and velocity in 3D space. Arrays of VCSELs may allow for power scaling and can provide very short pulses at higher power density.

SUMMARY

Some embodiments described herein are directed to a laser diode, such as a VCSEL or other surface-emitting laser diode or edge-emitting laser diode or other semiconductor laser, and arrays incorporating the same.

In some embodiments, the laser diode may be a surface-emitting laser diode. The laser diode includes a semiconductor structure comprising an n-type layer, an active region (which may comprise at least one quantum well layer), and a p-type layer. One of the n-type and p-type layers comprises a lasing aperture thereon that defines an optical axis oriented perpendicular to a surface of the active region between the n-type and p-type layers. The laser diode further includes first and second contacts electrically connected to the n-type and p-type layers, respectively. The first and/or second contacts are smaller than the lasing aperture in at least one dimension.

In some embodiments, the laser diode may be an edge-emitting laser diode. The laser diode includes an n-type layer, an active region, a p-type layer, and first and second contacts electrically connected to the n-type and p-type layers, respectively. A lasing aperture defines an optical axis oriented parallel to a surface of the active region between the n-type and p-type layers. The laser diode further includes first and second contacts electrically connected to the n-type and p-type layers, respectively. The first and/or second contacts may be smaller than the lasing aperture in at least one dimension.

In some embodiments, a method of fabricating a laser diode, such as a VCSEL or other surface-emitting or edge-emitting laser diode, is provided. The method may include fabricating an array of discrete laser diodes, for example, using micro-transfer printing, electrostatic adhesion, and/or other mass transfer techniques.

In some embodiments, an array of discrete laser diodes (also referred to herein as a laser diode array or laser array) is provided. The array of laser diodes may include surface-emitting laser diodes and/or edge-emitting laser diodes electrically connected in series and/or parallel by thin-film interconnects on non-native rigid and/or flexible substrates. The array of laser diodes may further include one or more driver transistors and/or devices of other types/materials (e.g. power capacitors, etc.) integrated in the array.

According to some embodiments, a laser array includes a plurality of laser diodes arranged and electrically connected to one another on a surface of a non-native substrate. Respective laser diodes of the plurality of laser diodes have different orientations relative to one another. The respective laser diodes are configured to provide coherent light emission in different directions, and the laser array is configured to emit an output beam comprising the coherent light emission from the respective laser diodes.

In some embodiments, the output beam may include incoherent light having a non-uniform intensity distribution over a field of view of the laser array. For example, the field of view may be about 80 degrees to about 180 degrees in some embodiments, or greater than about 150 degrees in some embodiments. In some embodiments, the laser array may be a LIDAR array.

In some embodiments, the non-native substrate may have a curvature that provides the different orientations of the respective laser diodes.

In some embodiments, the non-native substrate may be a flexible substrate that is bent to define the curvature.

In some embodiments, the non-uniform intensity distribution may be controllable responsive to a control signal to alter the curvature of the flexible substrate and/or responsive to power supplied to the respective laser diodes, for example, via selective addressing of the respective laser diodes.

In some embodiments, the flexible substrate may be supported by at least one mandrel element that is configured for movement in one or more directions responsive to the control signal, where the movement of the at least one mandrel element alters the curvature of the flexible substrate.

In some embodiments, the surface may be a back surface of the non-native substrate, the respective laser diodes may be arranged to provide the coherent light emission through the non-native substrate, and the non-native substrate may be formed of a material that is transparent to and is configured to at least partially collimate the coherent light emission.

In some embodiments, respective features on the surface of the non-native substrate may provide the different orientations of at least one of the respective laser diodes. In some embodiments, the respective features may include unequal-height features and/or recesses that are sized and spaced to provide the different orientations of the respective laser diodes. In some embodiments, the respective features may include respective patterned surfaces of the non-native substrate.

In some embodiments, the laser array may be configured to emit the output beam without a refractive optical element on the plurality of laser diodes.

In some embodiments, a lens array may be attached to the non-native substrate. The lens array may be configured to increase a divergence of the output beam in at least one dimension.

In some embodiments, a surface of the non-native substrate opposite the laser diodes may define the lens array.

In some embodiments, the lens array may be formed of a flexible material having a curvature corresponding to the non-native substrate and/or corresponding to the different orientations of the respective laser diodes.

In some embodiments, the lens array may include a primary lens array that is configured to increase the divergence of the output beam in a first direction, and a secondary lens array positioned to receive output beam from the primary lens array and increase the divergence thereof in a second direction. For example, the first direction may correspond to an azimuth angle of the output beam, and the second direction may correspond to an elevation angle of the output beam.

In some embodiments, the lens array may include at least one of a Fresnel lens, a plurality of shaped lenslets, or a plurality of ball lenses.

In some embodiments, respective ball lenses of the plurality of ball lenses may be suspended over respective subsets of the plurality of laser diodes. Optical axes of the respective ball lenses may be offset with respect to optical axes defined by respective lasing apertures of the respective subsets of the plurality of laser diodes.

In some embodiments, a subset of the plurality of laser diodes may define a column of the laser array, and the lens array may include a cylindrical lens that is aligned with the column.

In some embodiments, the respective laser diodes may include a residual tether portion and/or a relief feature at a periphery thereof.

In some embodiments, a spacing between immediately adjacent laser diodes of the plurality of laser diodes may be less than about 500 micrometers, less than about 200 micrometers, less than about 150 micrometers, less than about 100 micrometers, or less than about 50 micrometers, but greater than about 30 micrometers, greater than about 20 micrometers, or greater than about 10 micrometers.

In some embodiments, respective subsets of the plurality of laser diodes may be electrically connected in series (or anode-to-cathode, that is, such that an anode of at least one laser diode of a subset of the plurality is connected to a cathode of an adjacent laser diode of the subset, or vice versa) on the non-native substrate.

In some embodiments, the respective laser diodes may be surface-emitting lasers, and respective lasing apertures of the surface-emitting lasers may define optical axes that are oriented in the different directions, respectively. Respective electrical contacts to the surface-emitting lasers may be smaller than the respective lasing apertures thereof in at least one dimension that is orthogonal to the optical axes.

According to some embodiments, a method of fabricating a laser array includes providing a plurality of laser diodes arranged and electrically connected to one another on a surface of a non-native substrate. Respective laser diodes of the plurality of laser diodes have different orientations relative to one another. The respective laser diodes are configured to provide coherent light emission in different directions, and the laser array is configured to emit an output beam comprising the coherent light emission from the respective laser diodes. In some embodiments, the respective laser diodes may be provided on the surface of the non-native substrate using a micro-transfer printing process.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 3A is a perspective view illustrating a distributed emitter array including laser diodes in accordance with some embodiments described herein.

FIG. 3B is a perspective view illustrating a distributed emitter array including laser diodes on a curved substrate in accordance with some embodiments described herein.

FIGS. 4A-4F are perspective views illustrating an example fabrication process for laser diodes in accordance with some embodiments described herein.

FIGS. 4A'-4G' are cross-sectional views illustrating an example fabrication process for laser diodes in accordance with some embodiments described herein.

FIGS. 5A-5C are images of VCSEL arrays assembled in accordance with some embodiments described herein.

FIG. 6A is a perspective view illustrating an example emitter array including heterogeneous integration of distributed laser diodes and distributed driver transistors in accordance with some embodiments described herein.

FIG. 9 is a cross-sectional view illustrating an example laser diode array in accordance with further embodiments described herein.

FIGS. 13A and 13B are cross-sectional views and FIG. 13C is a perspective view illustrating example distributed emitter arrays including offset ball lens arrays for beam forming in accordance with some embodiments described herein.

DETAILED DESCRIPTION

Figure 1:
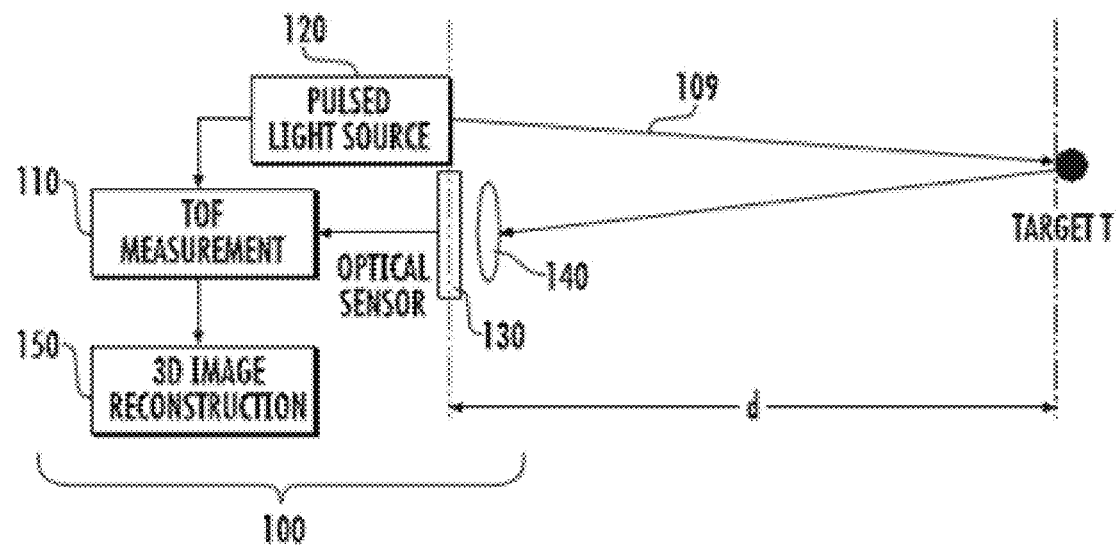
FIG. 1 is a diagram illustrating an example light-based 3D sensor system in accordance with some embodiments described herein.

Embodiments described herein may arise from realization that more compact arrays of light emitters may be advantageous in emerging technologies. For example, as shown in FIG. 1, a light-based 3D sensor system 100, such as a Light Detection and Ranging (LIDAR) system, may use time-of-flight (TOF)-based measurement circuit 110 and a 3D image reconstruction circuit 150 based on a signal received from an optical detector circuit 130 and associated optics 140, with a pulsed light emitting device array 120 as a light source. The time-of-flight measurement circuit 110 may determine the distance d to target T by measuring the round trip ("time-of-flight"; ToF) of a laser pulse 109 reflected by the target T (where d=(speed of light (c)/2)×ToF), which may be used by the 3D image reconstruction circuit 150 to create an accurate 3D map of surroundings. Some advantages of LIDAR systems may include long range; high accuracy; superior object detection and recognition; higher resolution; higher sampling density of 3D point cloud; and effectivity in diverse lighting and/or weather conditions. Applications of LIDAR systems may include ADAS (Advanced Driver Assistance Systems), autonomous vehicles, UAVs (unmanned aerial vehicles), industrial automation, robotics, biometrics, modeling, augmented and virtual reality, 3D mapping, and security. The example of FIG. 1 illustrates a flash LIDAR system, where the pulsed light emitting device array 120 emits light for short durations over a relatively large area to acquire images, in contrast with some traditional scanning LIDAR techniques (which generate image frames by raster scanning). However, it will be understood that light emitting device arrays 120 described herein can be used for implementations of scanning LIDAR as well.

Still referring to FIG. 1, the light emitting device array 120 may include a plurality of electrically connected surface-emitting laser diodes, such as VCSELs, and may be operated with strong single pulses at low duty cycle or with pulse trains, typically at wavelengths outside of the visible spectrum. Because of sensitivity to background light and the decrease of the signal with distance, several watts of laser power may be used to detect a target T at a distance d of up to about 100 meters or more.

However, some conventional VCSELs may have sizes defined by dimensions (e.g., length, width, and/or diameter) of about 150 micrometers (μm) to about 200 μm, which may impose size and/or density constraints on sensor systems including an array of discrete VCSELs. This relatively large VCSEL size may be dictated for use with conventional pick-and-place machines, as well as for sufficient contact surface area for wire bond pads to provide electrical connections to the VCSEL. For example, some conventional solder ball or wire bond technology may require more than about 30 μm in length for the bond pad alone, while the tip used to pull the wire bond may have an accuracy on the order of tens of micrometers.

Some embodiments described herein provide light emitting devices, such as surface-emitting laser diodes (e.g., VCSELs), having reduced dimensions (e.g., lengths and/or widths of about 30 micrometers (μm) or less) without affecting the device performance (e.g., power output). For example, the aperture of the VCSEL die (which is the active region where the lasing takes place) may be about 10 μm to about 20 μm in diameter. The die length can be reduced to the aperture diameter plus a few microns by reducing or eliminating wasted (non-active) area, and by retaining a few microns (e.g., about 4 μm to about 6 μm or less) of combined chip length for the anode and the cathode contacts. This may provide a reduction in dimensions (e.g., length and/or width) by a factor of about 10 or more (e.g., die lengths of about 15 micrometers (μm) to about 20 μm, as compared to some conventional VCELs with die lengths of about 150 μm to about 200 μm). In some embodiments, these reduced die dimensions may allow for fabrication of emitter arrays including a greater density (e.g., thousands) of VCSELs or other laser diodes.

Figure 2A:
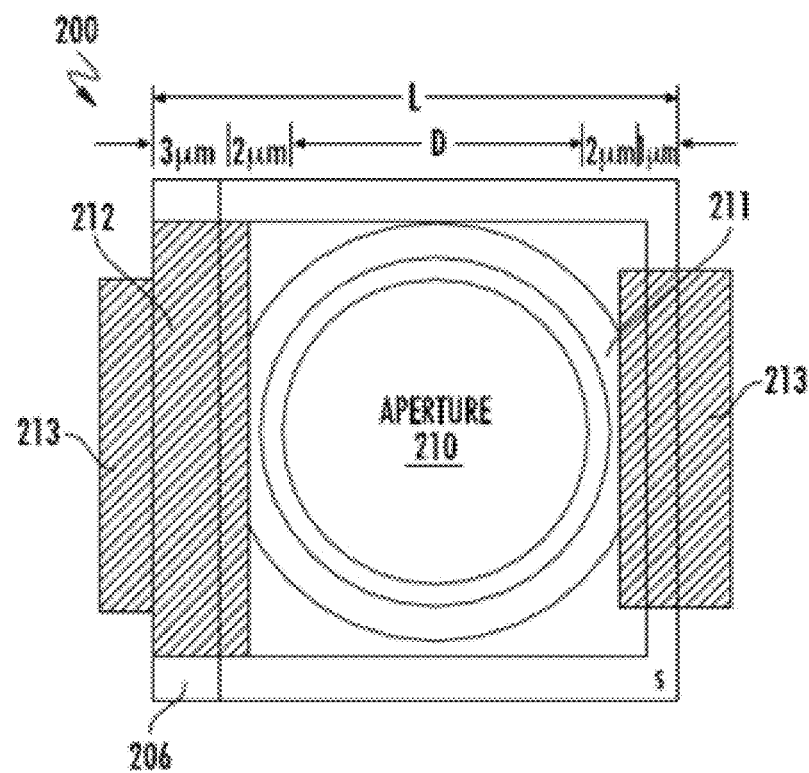
FIG. 2A is a plan view illustrating an example laser diode with reduced anode and cathode contact dimensions in accordance with some embodiments described herein.
Figure 2B:
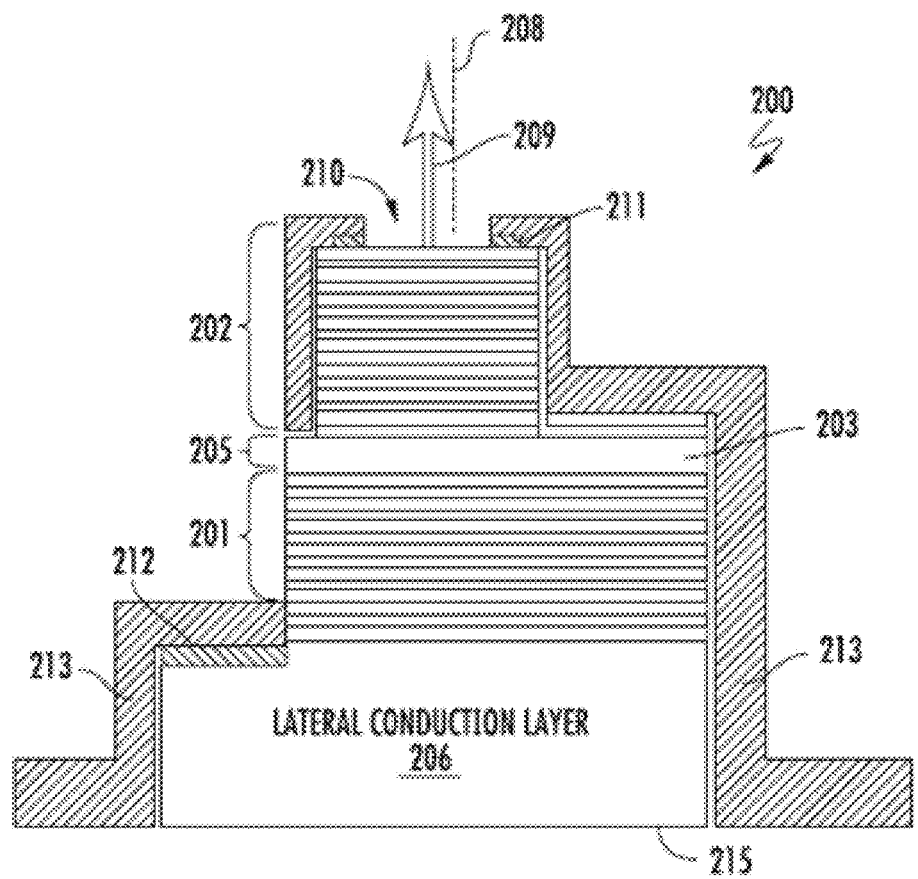
FIG. 2B is a cross-sectional view of the laser diode of FIG. 2A.

FIGS. 2A and 2B are plan and cross-sectional views illustrating an example surface-emitting light emitting device (shown as a vertical cavity surface emitting laser diode (VCSEL) chip or die 200, also referred to herein as a VCSEL 200) in accordance with some embodiments described herein, which includes anode and cathode contacts 211, 212 that are smaller than the lasing aperture 210 in at least one dimension. As shown in FIGS. 2A and 2B, the VCSEL 200 includes an active region 205 with one or more quantum wells 203 for generation and emission of coherent light 209. The optical cavity axis 208 of the VCSEL 200 is oriented along the direction of current flow (rather than perpendicular to the current flow as in some conventional laser diodes), defining a vertical cavity with a length along the direction of current flow. This cavity length of the active region 205 may be short compared with the lateral dimensions of the active region 205, so that the radiation 209 emerges from the surface of the cavity rather than from its edge.

The active region 205 may be sandwiched between distributed Bragg reflector (DBR) mirror layers (also referred to herein as Bragg reflector layers or Bragg mirrors) 201 and 202 provided on a lateral conduction layer (LCL) 206. The LCL 206 may allow for improved electrical and/or optical characteristics (as compared to direct contact to the reflector layer 401) in some embodiments. In some embodiments, a surface of the LCL layer 206 may provide a print interface 215 including an adhesive layer that improves adhesion with an underlying layer or substrate. The adhesive layer may be optically transparent to one or more wavelength ranges and/or can be refractive-index matched to provide desired optical performance. The reflector layers 201 and 202 at the ends of the cavity may be made from alternating high and low refractive index layers. For example, the reflector layers 201 and 202 may include alternating layers having thicknesses d1 and d2 with refractive indices n1 and n2 such that $n1 d1 + n2 d2 = \lambda/2$, to provide wavelength-selective reflectance at the emission wavelength $\lambda$. This vertical construction may increase compatibility with semiconductor manufacturing equipment. For example, as VCSELs emit light 209 perpendicular to the active region 205, tens of thousands of VCSELs can be processed simultaneously, e.g., by using standard semiconductor wafer processing steps to define the emission area and electrical terminals of the individual VCSELs from a single wafer.

Although described herein primarily with reference to VCSEL structures, it will be understood that embodiments described herein are not limited to VCSELs, and the laser diode 200 may include other types of laser diodes that are configured to emit light 209 along an optical axis 208 that is oriented perpendicular to a substrate or other surface on which the device 200 is provided. It will also be understood that, while described herein primarily with reference to surface-emitting laser structures, laser diodes and laser diode arrays as described herein are not so limited, and may include edge-emitting laser structures that are configured to emit light along an optical axis that is oriented parallel to a substrate or other surface on which the device is provided as well, as shown in the example of FIG. 9.

The VCSEL 200 may be formed of materials that are selected to provide light emission at or over a desired wavelength range, which may be outside of the spectrum of light that is visible to the human eye. For example, the VCSEL 200 may be a gallium arsenide (GaAs)-based structure in some embodiments. In particular embodiments, the active region 205 may include one or more GaAs-based layers (for example, alternating InGaAs/GaAs quantum well and barrier layers), and the Bragg mirrors 201 and 202 may include GaAs and aluminum gallium arsenide ($Al_xGa_{(1-x)}As$). For instance, the lower Bragg mirror 201 may be an n-type structure including alternating layers of n-AlAs/GaAs, while the upper Bragg mirror 202 may be a p-type structure including alternating layers of p-AlGaAs/GaAs. Although described by way of example with reference to a GaAs-based VCSEL, it will be understood that materials and/or material compositions of the layers 201, 202, and/or 205 may be tuned and/or otherwise selected to provide light emission at desired wavelengths, for example, using shorter wavelength (e.g., GaN-based) and/or longer wavelength (e.g., InP-based) emitting materials.

In the example of FIGS. 2A and 2B, the VCSEL 200 includes a lasing aperture 210 having a dimension (illustrated as diameter D) of about 12 µm, and first and second electrically conductive contact terminals (illustrated as anode contact 211 and cathode contact 212, also referred to herein as first and second contacts). A first electrically conductive film interconnect 213 is provided on the first contact 211, and a second electrically conductive film interconnect 213 is provided on the second contact 212 to provide electrical connections to the VCSEL 200. FIG. 2B more clearly illustrates the anode contact 211 and cathode contact 212 in cross section, with the conductive film interconnects 213 thereon. The first and second contacts 211 and 212 may provide contacts to semiconductor regions of opposite conductivity type (P-type and N-type, respectively). Accordingly, embodiments described herein are configured for transfer of electric energy to the VCSEL contacts 211 and 212 through thin-film interconnects 213, which may be formed by patterning an electrically conductive film, rather than incorporating wire bonds, ribbons, cables, or leads. The interconnections 213 may be formed after providing the VCSEL 200 on a target substrate (e.g., a non-native substrate that is different from a source substrate on which the VCSEL 200 is formed), for example, using conventional photolithography techniques, and may be constructed to have low resistance. In this regard, materials for the electrically conductive film interconnects 213 may include aluminum or aluminum alloys, gold, copper, or other metals formed to a thickness of approximately 200 nm to approximately 500 nm.

As shown in FIG. 2A, the first and second conductive contacts 211 and 212 are smaller than the aperture 210 in one or more dimensions. In some embodiments, allowing about 2 µm to about 3 µm for the dimensions of each of the contacts 211, 212, the overall dimensions of the VCSEL die 200 can be significantly reduced. For example, for anode and cathode contacts that are 2 µm in length each, a dimension L can be reduced to about 16 µm (2 µm anode length+12 µm aperture+2 µm cathode length; all measured along dimension L) providing a 16×16 µm² die. As another example, for anode and cathode contacts that are 3 µm in length each, a dimension L can be reduced to about 18 µm (3 µm anode+12 µm aperture+3 µm cathode) providing a 18×18 µm² die. Die dimensions L may be further reduced or slightly increased for smaller aperture dimensions D (e.g., 10 µm) or larger aperture dimensions D (e.g., 20 µm). More generally, VCSEL dies 200 according to embodiments herein may achieve a contact area-to-aperture area ratio of about 0.05 to 30, about 0.1 to 20, about 1 to 10, or about 1 to 3, where the contact area refers to the surface area of electrical contacts 211 and/or 212 positioned on or adjacent the aperture 210 on the surface S. Also, although illustrated with reference to contacts 211, 212 and interconnections 213 at particular locations relative to the aperture 210, it will be understood that embodiments described herein are not so limited, and the contacts 211, 212 and interconnections 213 may be provided at other areas of the VCSEL die 200 (e.g., at corners, etc.).

VCSELs 200 in accordance with some embodiments described herein may be configured to emit light with greater than about 100 milliwatts (mW) of power within about a 1-10 nanosecond (ns) wide pulse width, which may be useful for LIDAR applications, among others. In some embodiments, more than 1 Watt peak power output with a 1 ns pulse width at a 10,000:1 duty cycle may be achieved from a single VCSEL element 200, due for instance to the reduced capacitance (and associated reduction in RLC time constants) as compared to some conventional VCSELs. VCSELs 200 as described herein may thus allow for longer laser lifetime (based upon low laser operating temperatures at high pulsed power), in combination with greater than about 200 meter (m) range (based on very high power emitter and increased detector sensitivity).

Figure 2C:
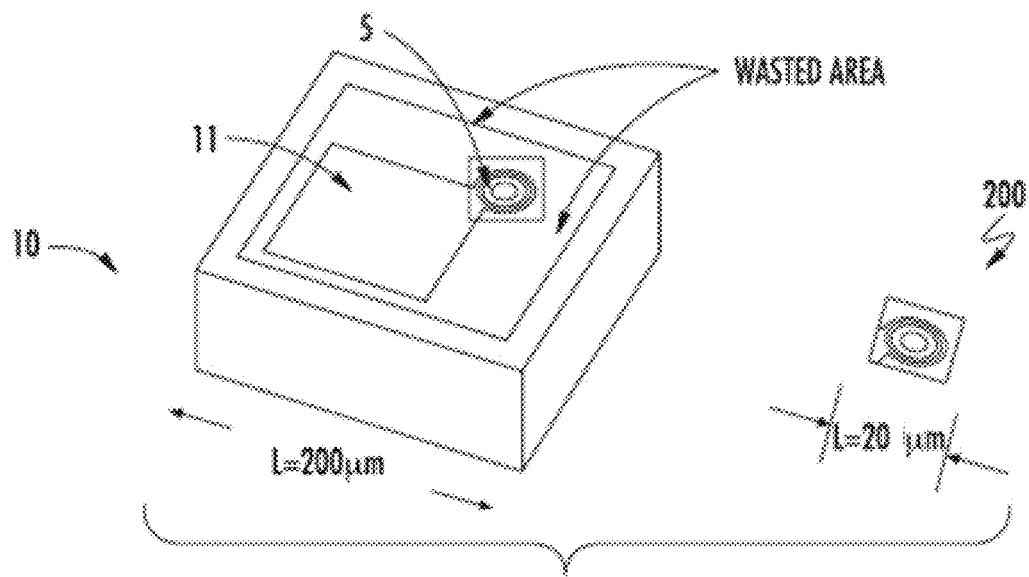
FIG. 2C is a perspective view illustrating an example laser diode in accordance with some embodiments described herein in comparison to a conventional VCSEL chip.

FIG. 2C is a plan view illustrating the VCSEL chip 200 in accordance with some embodiments described herein in comparison to a conventional VCSEL chip 10. As shown in FIG. 2C, the conventional VCSEL chip 10 may have a length L of about 200 μm, to provide sufficient area for the active region 5 and the top conductive wire bond pad 11, which may function as an n-type or p-type contact. In contrast, VCSEL chips 200 in accordance with some embodiments described herein may have a length L of about 20 μm or less. As electrical connections to the smaller contacts 211, 212 are provided by thin-film metallization interconnects 213, VCSEL chips 200 in accordance with some embodiments described herein require no bond pad, such that the optical aperture 210 occupies a majority of the overall surface area of the emitting surface S.

VCSEL chips 200 according to some embodiments of the present invention may thus have dimensions that are $1/100^{th}$ of those of some conventional VCSEL chips 10, allowing for up to one hundred times more power per area of the emitting surface S, as well as reduced capacitance which may substantially reduce the RLC time constants associated with driving fast pulses into these devices. Such an exponential reduction in size may allow for fabrication of VCSEL arrays including thousands of closely-spaced VCSELs 200, some of which are electrically connected in series (or anode-to-cathode) on a rigid or flexible substrate, which may not be possible for some conventional closely spaced VCSELs that are fabricated on a shared electrical substrate. For example, as described in greater detail below, multiple dies 200 in accordance with some embodiments described herein may be assembled and electrically connected within the footprint of the conventional VCSEL chip 10. In some applications, this size reduction and elimination of the bond pad may allow for reduction in cost (of up to one hundred times), device capacitance, and/or device thermal output, as compared to some conventional VCSEL arrays.

FIG. 3A is a perspective view illustrating a distributed emitter array 300a including laser diodes (illustrated as VCSELs 200) in accordance with some embodiments described herein. The array 300a (also referred to herein as a distributed VCSEL array (DVA)) may be assembled on a non-native substrate 307a, for example, by micro-transfer printing, electrostatic adhesion, or other mass transfer techniques. As used herein, a non-native substrate (also referred to herein as a target substrate) may refer to a substrate on which the laser diodes 200 are arranged or placed, which differs from a native substrate on which the laser diodes 200 are grown or otherwise formed (also referred to herein as a source substrate). The substrate 307a may be rigid in some embodiments, or may be flexible in other embodiments, and/or may be selected to provide improved thermal characteristics as compared to the source substrate. For example, in some embodiments the non-native substrate 307a may be thermally conducting and also electrically insulating (or coated with an insulating material, such as an oxide, nitride, polymer, etc.). Electrically conductive thin-film interconnects 313 may be formed to electrically connect respective contacts of the laser diodes 200 in series and/or parallel configurations, and may be similar to the interconnects 213 described above. This may allow for dynamically adjustable configurations, by controlling operation of subsets of the laser diodes 200 electrically connected by the conductive thin-film interconnects 313. In some embodiments, the array 300a may include wiring 313 between VCSELs 200 that are not connected in parallel (e.g., connections without a shared or common cathode/anode). That is, the electrically conductive thin-film interconnects 313 may provide numerous variations of series/parallel interconnections, as well as additional circuit elements which may confer good yield (e.g. bypass routes, fuses, etc.).

The conductive thin-film interconnects 313 may be formed in a parallel process, before and/or after providing the laser diodes 200 on the substrate 307a. For example, the conductive thin-film interconnects 313 may be formed by patterning an electrically conductive film on the substrate 307a using conventional photolithography techniques, such that the laser diodes 200 of the array 300 are free of electrical connections through the substrate 307a.

Due to the small dimensions of the laser diodes 200 and the connections provided by the conductive thin-film interconnects 313, a spacing or pitch between two immediately adjacent laser diodes 200 is less than about 500 micrometers (μm), or in some embodiments, less than about 200 μm, or less than about 150 μm, or less than about 100 μm, or less than about 50 μm, without connections to a shared or common cathode/anode. While some monolithic arrays may provide inter-laser diode spacings of less than about 100 μm, the laser diodes of such arrays may electrically share a cathode/anode and may mechanically share a rigid substrate in order to achieve such close spacings. In contrast, laser diode arrays as described herein (such as the array 300a) can achieve spacings of less than about 150 μm between immediately adjacent, serially-connected laser diodes 200 (that do not have a common anode or cathode connection), on non-native substrates (e.g., rigid or flexible substrates) in some embodiments. In addition, as described below with reference to the examples of FIGS. 6A-6C, some embodiments of the present disclosure may integrate other types of devices and/or devices formed from different materials (e.g. power capacitors, FETs, etc.) in-between laser diodes 200 at the sub-150 μm spacings described herein.

Also, in some embodiments, a concentration of the laser diodes 200 per area of the array 300a may differ at different portions of the array 300a. For example, some LIDAR sensor applications may benefit from higher resolution in a central portion of the array (corresponding to a forward direction of travel), but may not require such high resolution at peripheral regions of the array. As such, a concentration of VCSELs 200 at peripheral portions of the array 300a may be less than a concentration of VCSELs 200 at a central portion of the array 300a in some embodiments. This configuration may be of use in applications where the substrate is flexible and may be curved or bent in a desired shape, as shown in FIG. 3B.

FIG. 3B is a perspective view illustrating a distributed emitter array 300b including laser diodes 200 on a curved, non-native substrate 307b in accordance with some embodiments described herein. In some embodiments, the substrate 307b is formed of a flexible material that can be bent to provide curved emitting surface, such that VCSELs 200 mounted on a central portion 317 of the substrate 307b face a forward direction, while VCSELs 200 mounted on peripheral portions 317' of the substrate 307b face oblique directions. As the VCSELs 200 respectively emit light in a direction perpendicular to their active regions, the VCSELs 200 mounted on the central portion 317 emit light 309 in the forward direction, while the VCSELs 200 mounted on peripheral portions 317' of the substrate 307b emit light 309' in oblique directions, providing a wide field of view. In some embodiment, each VCSEL may provide narrow-field illumination (e.g., covering less than about 1 degree), and the arrays 300a, 300b may include hundreds or thousands of VCSELs 200 (e.g., an array of 1500 VCSELs, each covering a field of view of about 0.1 degree, can provide a 150 degree field of view).

The field of view can be tailored or changed as desired from 0 degrees up to about 180 degrees by altering the curvature of the substrate 307b. The curvature of the substrate 307b may or may not be constant radius, and can thereby be designed or otherwise selected to provide a desired power distribution. For example, the substrate 307b may define a cylindrical, acylindrical, spherical or aspherical curve whose normal surfaces provide a desired distribution of relative amounts of power. In some embodiments, the curvature of the substrate 307b may be dynamically altered by mechanical or electro-mechanical actuation. For example, a mandrel can be used to form the cylindrical or acylindrical shape of the flexible non-native substrate 307b. The mandrel can also serve as a heat sink in some embodiments. Also, as mentioned above, a spatial density or concentration of VCSELs 200 at peripheral portions of the array 300b may be less than a concentration of VCSELs 200 at a central portion of the array 300b in some embodiments. For example, rows or columns of the array 300b of VCSELs 200 may be arranged on the non-native substrate 307b at different and/or non-uniform pitches to provide a desired far-field output light pattern, for instance, using micro-transfer printing and/or other micro-assembly techniques.

The arrays 300a and 300b illustrated in FIGS. 3A and 3B may be scalable based on a desired quantity or resolution of laser diodes 200, allowing for long range and high pulsed power output (on the order of kilowatts (kW)). The spatial density or distribution of the laser diodes 200 on the surfaces of the substrates 307a and 307b can be selected to reduce optical power density, providing both long range and eye safety at a desired wavelength of operation (e.g., about 905 nm for GaAs VCSELs; about 1500 nm for InP VCSELs). A desired optical power density may be further achieved by controlling the duty cycle of the signals applied to the VCSELs and/or by altering the curvature of the substrate. Also, the separation or spacing between adjacent laser diodes 200 within the arrays 300a and 300b may be selected to provide thermal management and improve heat dissipation during operation, depending on the substrate material. For example, a spacing between two immediately adjacent laser diodes 200 of greater than about 100 μm micrometers (μm) may provide thermal benefits, especially for substrates with limited thermal conductivity. The arrays 300a and 300b as described herein may thereby provide greater reliability, by eliminating wire bonds, providing a fault-tolerant architecture, and/or providing lower operating temperatures. In further embodiments, self-aligning, low-cost beam forming micro-optics (e.g., ball lens arrays) may be integrated on or into the surface of the arrays 300a and 300b.

The compact arrays 300a and 300b shown in FIGS. 3A and 3B may be fabricated in some embodiments using micro-transfer printing (MTP), electrostatic adhesion, and/or other massively parallel chip handling techniques that allow simultaneous assembly and heterogeneous integration of thousands of micro-scale devices on non-native substrates via epitaxial liftoff. For example, the arrays of VCSELs 200 can be fabricated using micro-transfer printing processes similar to those described, for example, in U.S. Pat. No. 7,972,875 to Rogers et al. entitled "Optical Systems Fabricated By Printing-Based Assembly," the disclosure of which is incorporated by reference herein in its entirety. The arrays of VCSELs 200 can alternatively be fabricated using electrostatic adhesion or gripping transfer techniques similar to those described, for example in U.S. Pat. No. 8,789,573 to Bibl et al. entitled "Micro device transfer head heater assembly and method of transferring a micro device," the disclosure of which is incorporated by reference herein in its entirety. In some embodiments, MTP, electrostatic adhesion, and/or other mass transfer techniques may allow for fabrication of VCSEL or other arrays of laser diodes with the small inter-device spacings described herein.

FIGS. 4A-4F are perspective views and FIGS. 4A'-4G' are cross-sectional views illustrating an example fabrication process for laser diodes (illustrated as VCSELs 400) in accordance with some embodiments described herein. The VCSELs 200 described herein may also be fabricated using one or more of the processing operations shown in FIGS. 4A-4F in some embodiments. As shown in FIGS. 4A-4F and FIGS. 4A'-4G', ultra small VCSELs 400 in accordance with embodiments described herein can be grown on source substrates and assembled on a non-native target substrate using micro-transfer printing techniques. In particular, in FIGS. 4A and 4A', sacrificial layer 408, a lateral conduction layer 406, a first, n-type distributed Bragg reflector (DBR) layer 401, an active region 405, and a second, p-type DBR layer 402 are sequentially formed on a source wafer or substrate 404. Although illustrated with reference to a single VCSEL 400 to show fabrication, it will be understood that a plurality of VCSELs 400 may be simultaneously fabricated on the source wafer 404, with reduced or minimal spacing between adjacent VCSELs 400 to increase or maximize the number of VCSELs that may be simultaneously fabricated on the wafer 404. Also, it will be understood that a plurality of VCSEL devices may be fabricated on a single die or chiplet that is released from the substrate 404 for printing. Also, the transfer techniques described in greater detail below may allow for reuse of the source wafer 404 for subsequent fabrication of additional VCSELs.

In some embodiments, the material compositions of the layers 406, 401, 405, and 402 may be selected to provide a desired emission wavelength and emission direction (optical axis). For example, the layers 406, 401, 405, and 402 may be gallium arsenide (GaAs)-based or indium phosphide (InP)-based in some embodiments. As illustrated, a lateral conduction layer 406, an AlGaAs n-type high-reflectivity distributed Bragg reflector (DBR), and an active region 405 are sequentially formed on the source wafer 404. The active region 405 may be formed to include InAlGaAs strained quantum wells designed to provide light emission over a desired wavelength, and is followed by formation of a p-type DBR output mirror 402. A top contact metallization process is performed to form a p-contact (e.g., an anode contact) 411 on the p-type DBR layer 402. For example, Ti/Pt/Au ring contacts of different dimensions may be deposited to form the anode or p-contact 411. An aperture 410 may be defined within a perimeter of the p-contact 411. In some embodiments, an oxide layer may be provided between the active region 405 and the p-type DBR layer 402 to define boundaries of the aperture 410. The placement and design of the aperture 410 may be selected to minimize optical losses and current spreading.

In FIGS. 4B and 4B', a top mesa etching process is performed to expose the active region 405 and a top surface of the n-type DBR layer 401, and an oxidation process is performed to oxidize the exposed surfaces, (including the exposed sidewalls of the active region 405), and in particular to laterally define boundaries of the optical aperture 410. In FIGS. 4C and 4C', a bottom contact metallization process is performed to expose and form an n-type (e.g., cathode) contact 412 on a surface of the lateral conduction layer 406. It will be understood that, in some embodiments, the n-type contact 412 may alternatively be formed on the n-type DBR layer 401 to provide the top-side contact. In FIGS. 4D and 4D', an isolation process is performed to define respective lateral conduction layers 406, and an anchor material (e.g., photoresist layer) is deposited and etched to define photoresist anchors 499 and inlets to expose sacrificial release layer 408 for epitaxial lift-off.

In FIGS. 4E and 4E', an undercut etching process is performed to remove portions of the sacrificial release layer 408 such that the anchors 499 suspend the VCSEL die 400 over the source wafer 404. In some embodiments, the operations of FIGS. 4E and 4E' may be followed by a micro-transfer printing process, as shown in FIGS. 4F and 4F', which may utilize an elastomeric and/or other stamp 490 to break the anchors 499, adhere the VCSEL die 400 (along with multiple other VCSEL dies 400 on the source wafer 404) to a surface of the stamp 490, and simultaneously transfer the multiple VCSEL dies 400 (which have been adhered to the surface of the stamp) to a non-native target substrate 407 by contacting the surface of the stamp including the dies 400 thereon with a surface of the non-native target substrate 407, as shown in FIG. 4G'. In other embodiments, the operations of FIG. 4F may be followed by an electrostatic gripper-based transfer process, which may utilize an electrostatic transfer head to adhere the VCSEL die 400 (along with multiple other VCSEL dies 400 on the source wafer 404) to a surface of the head using the attraction of opposite charges, and simultaneously transfer the VCSEL dies 400 to a non-native target substrate. As a result of breaking the anchors 499, each VCSEL die 400 may include a broken or fractured tether portion 499t (e.g., a residual portion of the anchor structure 499) protruding from or recessed within an edge or side surface of the die 400 (and/or a corresponding relief feature at a periphery of the die 400), which may remain upon transfer of the VCSEL dies 400 to the non-native substrate 407.

The non-native target substrate may be a rigid or flexible destination substrate for the VCSEL array, or may be a smaller interposer or "chiplet" substrate. Where the target substrate is the destination substrate for the array, an interconnection process may form a conductive thin film layer on the target substrate including the assembled VCSEL dies 400 thereon, and may pattern the conductive thin film layer to define thin-film metal interconnects that provide desired electrical connections between the VCSEL dies 400. The interconnection process may be performed after the VCSEL dies 400 are assembled on the destination substrate, or may be performed in a pre-patterning process on the destination substrate before the VCSEL dies 400 are assembled such that the electrical connections between the VCSEL dies 400 are realized upon assembly (with no interconnection processing required after the transfer of the dies 400 onto the substrate). Where the target substrate is a chiplet, the VCSEL dies 400 may be connected in parallel via the chiplet. The chiplets including the VCSEL dies 400 thereon may then be assembled (via transfer printing, electrostatic adhesion, or other transfer process) onto a destination substrate for the array, which may be pre- or post-patterned to provide electrical connections between the chiplets. The thin-film metal interconnects may be defined on and/or around the broken tether portion protruding from the edge of the die(s) 400 in some embodiments.

Because the VCSELs 400 are completed via epitaxial lift-off and thus are separated from the substrate, and because of the use of thin film interconnects, the VCSELs 400 may also be thinner than some conventional VCSELs which remain connected to their native substrate, such as the VCSEL 10 of FIG. 2C. For example, the VCSEL 400 may have a thickness t (e.g., a combined thickness of the semiconductor stack including the layers 406, 401, 405, and 402) of about 1 micrometers ($\mu m$) to about 20 $\mu m$.

FIGS. 5A-5C are images of VCSEL arrays 500 in accordance with some embodiments described herein, which were assembled using micro-transfer printing processes. In particular, FIG. 5A illustrates a VCSEL array 500 of about 11,000 lasers with an inter-VCSEL spacing of about 200 micrometers ($\mu m$) or less between adjacent VCSELs 200 after assembly on a non-native substrate 507, with the inset image of FIG. 5B and the image of 5C illustrating a magnified views of portions of the array 500 including about 350 lasers and 9 lasers, respectively, in accordance with some embodiments described herein. Due to the reduction in dimensions of the VCSELs described herein, the inter-VCSEL spacing between immediately adjacent VCSELs 200 may be less than about 150 $\mu m$, or less than about 100 $\mu m$ or less than about 50 $\mu m$ on the source substrate in some embodiments. In some embodiments, the array 500 may include 100 VCSELs or more within a footprint or area of 5 square millimeters ($mm^2$) or less.

Figure 5D:
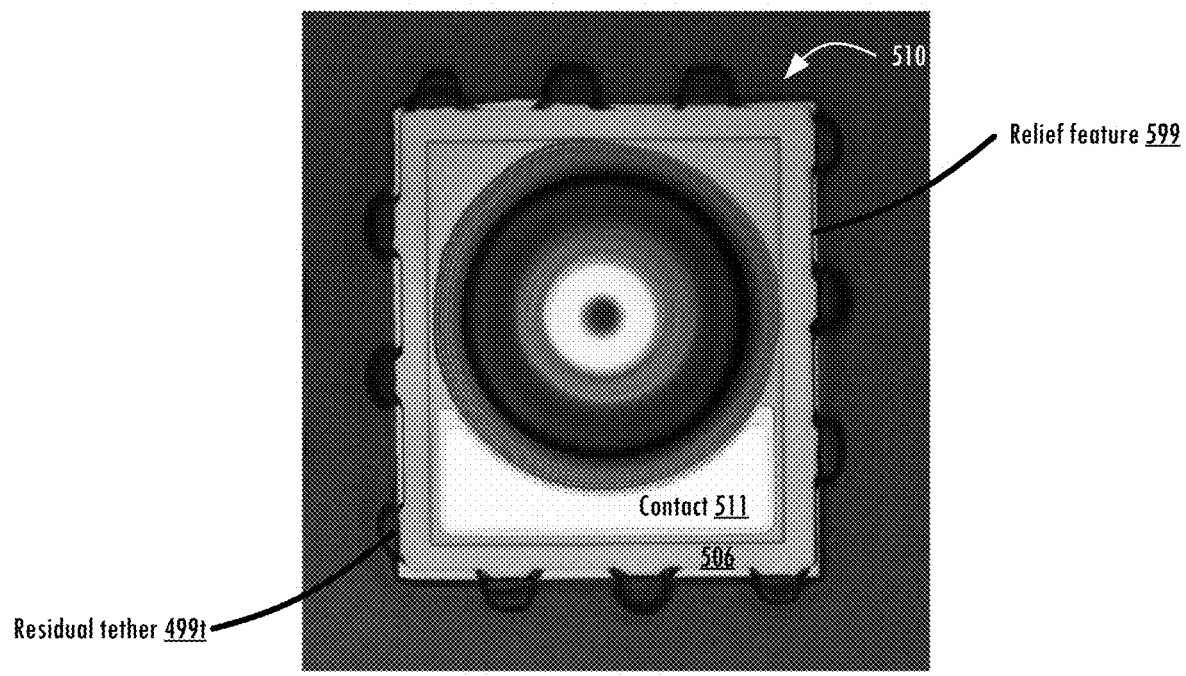
FIGS. 5D-5E are magnified images illustrating residual tether portions and relief features of VCSELs in accordance with some embodiments described herein.
Figure 5E:
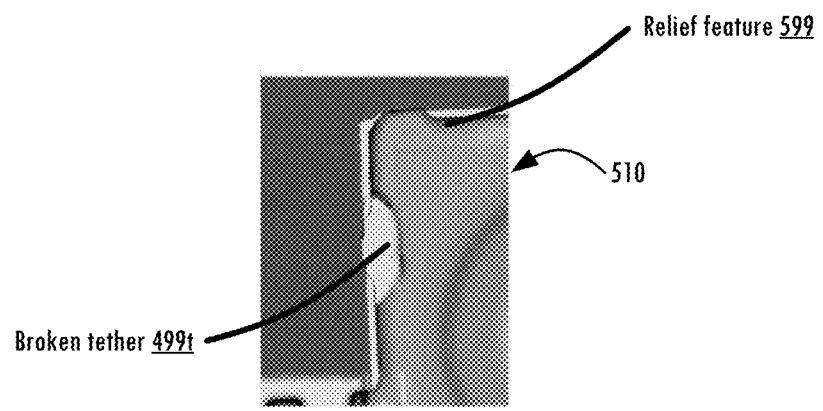

FIGS. 5D-5E are magnified images illustrating broken tether portions and relief features of VCSEL structures in accordance with some embodiments described herein. As shown in FIGS. 5D and 5E, a transfer-printed VCSEL 510 (such as one of the VCSELs 200) or other laser diode as described herein may include one or more broken tether portions 499t and/or relief features 599 at a periphery thereof. The relief features 599 may be patterned or otherwise provided along the periphery of VCSEL 510 to partially define the tethers 499 and areas for preferential fracture of the tethers 499. In the examples of FIGS. 5D-5E, the broken tether portions 499t and relief features 599 are illustrated as being present along a periphery of the lateral conduction layer (LCL) 506; however, it will be understood that broken tether portions 499t and/or relief features 599 may be present in or along a periphery of any of the layers that may be provided on a non-native substrate by transfer-printing processes described herein, for example, any of the epitaxially grown layers 406, 405, 401, 402 formed in fabricating the active region 405 on a source wafer or substrate 404 in the examples of FIGS. 4A-4F and 4A'-4G'. As such, in some embodiments, the broken tether portion 499t may comprise a material and thickness corresponding to that of the LCL layer 506 (or other layer associated with the active region). In further embodiments, to shorten an etch sequence, peripheral or edge portions of the LCL 506 may be partially etched, and as such, the relief pattern 599 of the tether features 499t may be thinner than the LCL 506 (or other layer associated with the active region). The fracture of the tethers 499 during the "Pick" operation (such as shown in FIG. 4G') may occur in the resist layer 499l itself, and the broken tether portions 499t may comprise a material and thickness corresponding to that of the resist layer 499l. The broken tether portion 499t may interact with the print adhesive or epoxy, and also remains on the fully processed device, even after resist develop and/or resist removal processes. More generally, some laser diode structures in accordance with embodiments described herein may include at least one of a broken tether portion 499t or a relief pattern or feature 599 at areas adjacent the tethers 499 along a periphery or edge of the laser diode structure.

Accordingly, some embodiments described herein may use MTP to print and integrate hundreds or thousands of VCSELs or other surface-emitting laser diodes into small-footprint light-emitting arrays. MTP may be advantageous by allowing simultaneous manipulation and wafer-level assembly of thousands of laser diode devices. In some embodiments, each of the laser diodes may have aperture dimensions as small as about 1-10 μm, thereby reducing the size (and cost) of lasers incorporating such VCSEL arrays by a factor of up to 100. Other embodiments may include substrates with aperture dimensions even smaller than about 1 μm in order to realize different performance such as modified near and far field patterns. Still other embodiments may use larger apertures, for example, about 10-100 μm, in order to realize higher power output per VCSEL device. Also, MTP allows reuse of the source wafer (e.g., GaAs or InP) for growth of new devices after the transfer printing process, further reducing fabrication costs (in some instances, by up to 50%). MTP may also allow heterogeneous integration and interconnection of laser diodes of different material systems (e.g., GaAs or InP lasers) and/or driver transistors (as discussed below) directly onto silicon integrated circuits (ICs). Also, source wafers may be used and reused in a cost-effective manner, to fabricate laser diodes (e.g., InP-based VCSELs) that can provide high power with eye safety, as well as reduced ambient noise. As such, MTP may be used in some embodiments to reduce emitter costs, and allow fabrication of high power, high resolution distributed VCSEL arrays (DVAs) including multiple hundreds or thousands of VCSELs.

Also, when provided on flexible or curved substrates, embodiments described herein can provide DVAs having a wide field of view (FoV), up to 180 degrees horizontal. In some embodiments, the optical power dispersed via the DVA can be configured for eye safety and efficient heat dissipation. In some embodiments, low-cost, self-aligning, beam forming micro-optics may be integrated within the curved DVA.

Figure 6B:
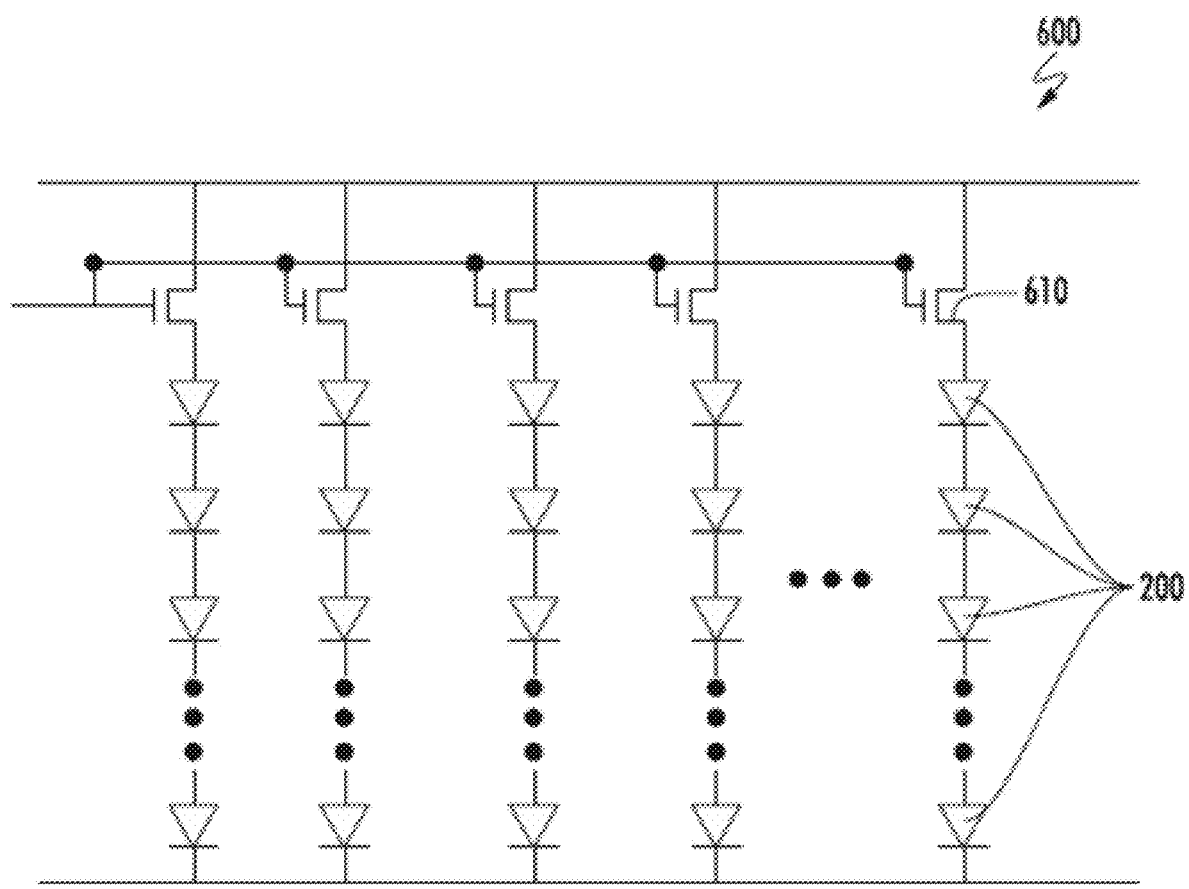
FIG. 6B is schematic view illustrating an equivalent circuit diagram for the distributed emitter array of FIG. 6A.

FIG. 6A is a perspective view illustrating an example emitter array 600 including heterogeneous integration of distributed surface-emitting laser diodes (illustrated as VCSELs 200) and distributed driver transistors 610 in accordance with some embodiments described herein. As used herein, distributed circuit elements may refer to laser diodes, driver transistors, and/or other circuit elements that are assembled in various desired positions throughout a laser diode array, and such an array of distributed circuit elements is referred to herein as a distributed array. For example, integration of distributed high power driver transistors in a distributed VCSEL array may be advantageous for LIDAR applications. FIG. 6B is schematic view illustrating an equivalent circuit diagram for the distributed emitter array 600 of FIG. 6A, and FIG. 6C is a cross-sectional view of the distributed emitter array 600 taken along line 6C-6C' of FIG. 6A.

Figure 6C:
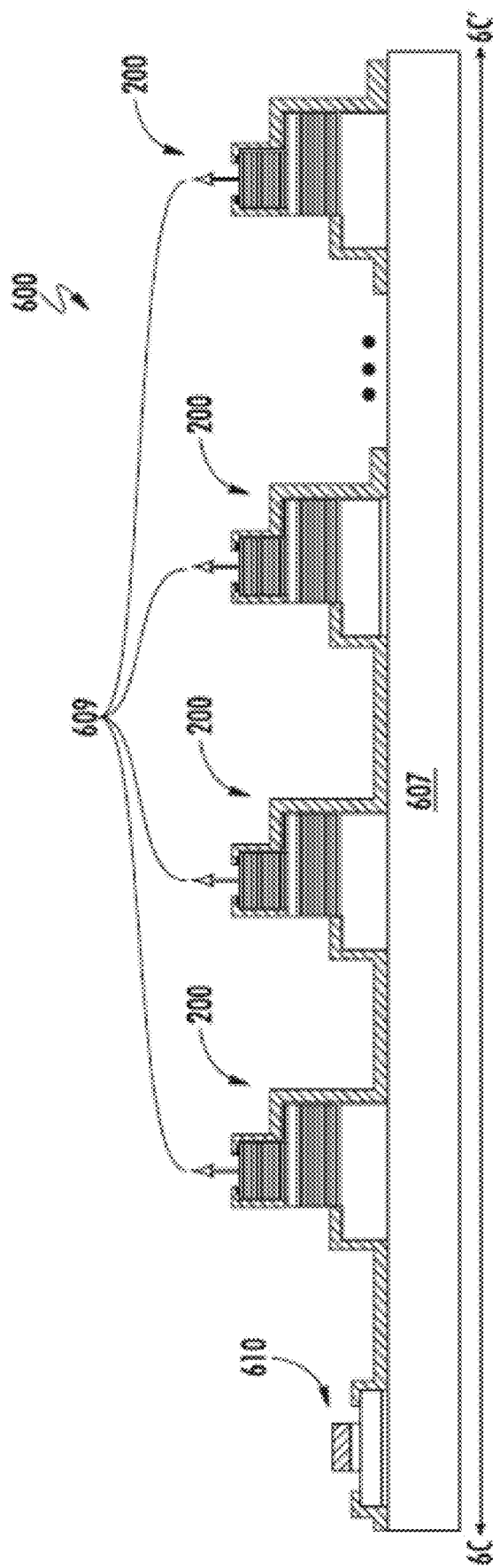
FIG. 6C is a cross-sectional view of the distributed emitter array taken along line 6C-6C' of FIG. 6A.

As shown in FIGS. 6A-6C, the array 600 (also referred to herein as a DVA) may be assembled on a non-native substrate 607, for example, by micro-transfer printing or other techniques. The substrate 607 may be rigid in some embodiments, or may be flexible in other embodiments. The array 600 further includes integrated driver transistors 610 that are assembled on the substrate 607 adjacent to one or more of the VCSELs 200. In some embodiments, the drivers 610 and laser diodes 200 may include different semiconductor materials and/or technologies that have incompatible fabrication processes. For example, the driver transistors 610 may be assembled on the substrate 607 using a micro-transfer printing (MTP) process. In some embodiments, an array including hundreds or thousands of driver transistors 610 may be provided. Electrically conductive thin-film interconnects 613 may be formed to electrically connect respective contacts of the driver transistors 610 and laser diodes 200 in series and/or parallel configurations. Spacings between a driver transistor 610 and an immediately adjacent laser diodes 200 may be less than about 2 millimeters, less than about 1 millimeter, less than about 500 micrometers, less than about 150 micrometers (μm), or in some embodiments, less than about 100 μm, or less than about 50 μm, which may provide reduced parasitic impedance therebetween (e.g., up to 100 times lower than where the driver transistor 610 is located off-chip or off-substrate).

In some embodiments, the array 600 may include wiring 613 between VCSELs 200 that are not connected in parallel (e.g., no common cathode/anode). Interconnection designs that do not simply place all elements of the array in parallel (e.g., without a common anode or cathode connection) may offer the advantage of lowering current requirements for the array, which can reduce inductive losses and increase switching speed. Varied interconnection designs also provide for the inclusion of other devices embedded or integrated within the electrically interconnected array (e.g., switches, gates, FETs, capacitors, etc.) as well as structures which enable fault tolerance in the manufacture of the array (e.g. fuses, bypass circuits, etc.) and thus confer yield advantages. For example, as illustrated in FIG. 6B, the array 600 includes a plurality of strings of VCSELs 200 that are electrically connected in series (or anode-to-cathode) to define columns (or other subsets or sub-arrays) of the array 600. The array 600 further includes an array of driver transistors 610, with each driver 610 electrically connected in series with a respective string of serially-connected (or otherwise anode-to-cathode-connected) VCSELs 200.

The conductive thin-film interconnects 613 may be formed in a parallel process after providing the laser diodes 200 and driver transistors 610 on the substrate 607, for example by patterning an electrically conductive film using conventional photolithography techniques. As such, the driver transistors 610 and laser diodes 200 of the array 600 are free of wire bonds and/or electrical connections through the substrate 607. Due to the smaller dimensions of the laser diodes 200 and the driver transistors 610 and the degree of accuracy of the assembly techniques described herein, a spacing between immediately adjacent laser diodes 200 and/or driver transistors 610 may be less than about 150 micrometers (μm), or in some embodiments, less than about 100 μm or less than about 50 μm. Integrating the driver transistors 610 on the substrate 607 in close proximity to the VCSELs 200 (for example, at distances less than about 2 millimeters, less than about 1 millimeter, less than about 500 micrometers, less than about 150 micrometers (μm), or in some embodiments, less than about 100 μm, or less than about 50 μm from a nearest VCSEL 200) may thus shorten the electrical connections 613 between elements, thereby reducing parasitic resistance, inductance, and capacitance, and allowing for faster switching response.

In the example of FIGS. 6A-6C, the driver transistors 610 are arranged in an array such that each driver transistor 610 is connected in series with a column (or other subset) of serially-connected (or otherwise anode-to-cathode-connected) VCSELs 200, allowing for individual control of respective columns/strings of VCSELs 200. However, it will be understood that embodiments described herein are not limited to such a connection configuration. To the contrary, integrating the driver transistors 610 in close proximity to the VCSELs 200 may also allow for greater flexibility in wiring configurations (e.g., in series and/or parallel), which may be used to control current and/or increase or maximize performance. For example, fewer or more driver transistors 610 may be provided (e.g., drivers for control of rows of serially-connected VCSELs 200 as well as columns) for finer control of respective VCSELs or groups of VCSELs and/or output power. Another example would be the addition of capacitors or similar electrical storage devices close to the elements of the array for faster pulse generation, for example, on the order of sub-nanosecond (ns), in contrast to some conventional designs that may be on the order of about 1-10 ns or more. Likewise, although illustrated as a planar array 600, the substrate 607 may be flexible in some embodiments; thus, the array 600 may be bent to provide a desired curvature, similar to the array 300b of FIG. 3B.

As similarly discussed above with reference to the arrays 300a and 300b, the array 600 may be scalable based on a desired quantity or resolution of laser diodes 200, allowing for long range and high pulsed power output (on the order of kilowatts (kW)). The distribution of the laser diodes 200 on the surfaces of the substrate 607 can be selected and/or the operation of the laser diodes can be dynamically adjusted or otherwise controlled (via the transistors 610) to reduce optical power density, providing both long range and eye safety at a desired wavelength of operation (e.g., about 905 nm for GaAs VCSELs; about 1500 nm for InP VCSELs). Also, the spacing between elements 200 and/or 610 may be selected to provide thermal management and improve heat dissipation during operation. Arrays 600 as described herein may thereby provide improved reliability, by eliminating wire bonds, providing a fault-tolerant architecture, and/or providing lower operating temperatures. In further embodiments, self-aligning, low-cost beam forming micro-optics (e.g., ball lens arrays) may be integrated on or into the surface of the substrate 607, as discussed below with reference to FIGS. 12A-12B.

Figure 6D:
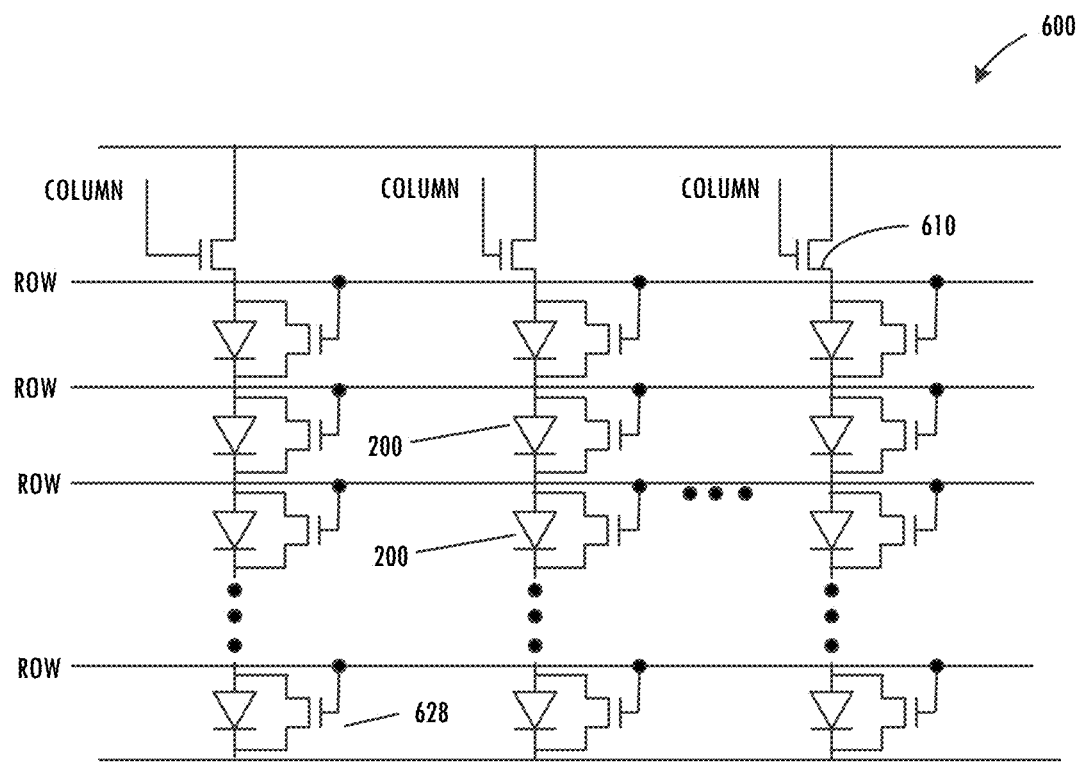
FIG. 6D is schematic view illustrating an alternate equivalent circuit diagram for the distributed emitter array of FIG. 6A.

FIG. 6D is a schematic view illustrating an equivalent circuit diagram of the distributed emitter array 600 of FIG. 6A in which the emitters 200 are individually addressable. As illustrated in FIG. 6D, the array 600 includes a plurality of strings of VCSELs 200 that are electrically connected in series (or anode-to-cathode) to define columns or other subsets or sub-arrays of the array 600. The array 600 further includes an array of driver transistors 610, with each driver transistor 610 electrically connected in series with a respective string of serially-connected VCSELs 200. The driver transistors 610 may be individually addressable via column signals COLUMN. In some embodiments, the driver transistors 610 may be individually activated (e.g., biased so as to be conducting) so as to vary power provided to a respective string of the serially-connected VCSELs 200. In some embodiments, the driver transistors 610 may be operated in linear mode so as to vary a resistance of the driver transistor 610 and accordingly vary a current applied to the string of serially-connected (or otherwise anode-to-cathode-connected) VCSELs 200.

Rows of the array 600 may also be individually addressable. For example, the array 600 may utilize bypass circuits to individually select one of the rows of the string of serially connected VCSELs 200. In some embodiments, individual bypass transistors 628 may be utilized to select respective ones of the VCSELs 200. For example, to select a particular VCSEL 200 at a particular row and column, the driver transistor 610 for the string containing the particular VCSEL 200 may be activated to provide current through the string, and the bypass transistor 628 associated with the particular VCSEL 200 may be turned off (e.g., biased so as to be non-conducting) so that current through the string may flow through the VCSEL 200. In some embodiments, the bypass transistor 628 may be operated in linear mode to provide a variable resistance along the bypass path. The variable resistance may allow for control of the amount of current flowing through the VCSEL 200.

The circuit embodiment of FIG. 6D is merely an example of how the array of emitters 600 may be configured to be both row and column addressable. However, the embodiments described herein are not limited to this particular arrangement. One of ordinary skill in the art will recognize that other potential circuit arrangements are possible to implement an active matrix of devices that may be selectively addressed by both row and column, for example, to direct a larger fraction of pulse energy to some subset of the VCSELs in order to modify the far field pattern of the emitted output beam, such that only certain directions are receiving a greater amount of power. Such circuit arrangements may be used instead of the circuit arrangement of FIG. 6D without deviating from the scope of the embodiments described herein.

Figure 7A:
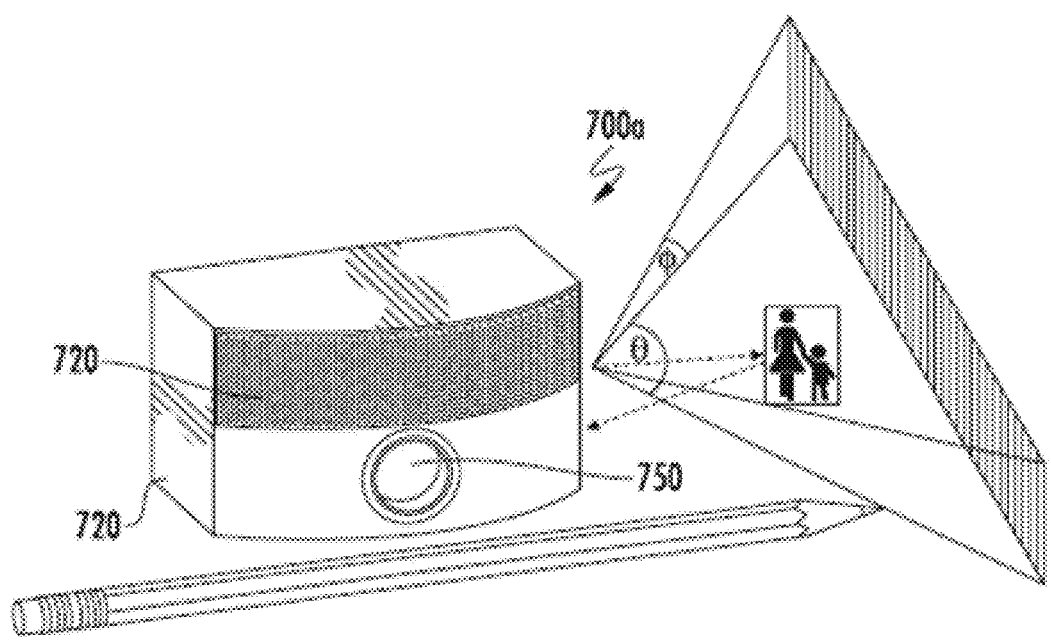
FIG. 7A is a perspective view illustrating an example LIDAR device in accordance with some embodiments described herein.

FIG. 7A is a perspective view illustrating a LIDAR device 700a including surface-emitting laser diodes (such as the VCSELs 200) in accordance with embodiments described herein, illustrated relative to a pencil for scale. FIG. 7C is a perspective view illustrating an alternative LIDAR device 700c in accordance with embodiments described herein. In particular, FIGS. 7A and 7C illustrate a distributed vertical-cavity-surface-emitting laser (VCSEL) array-based, solid-state Flash LIDAR device 700a, 700c. The LIDAR device 700a, 700c is illustrated with reference to a curved array 720, such as the curved array 300b of FIG. 3B, but it will be understood that the LIDAR device 700a, 700c is not so limited, and may alternatively implement the array 300a of FIG. 3A, the array 600 of FIGS. 6A-6C, and/or other arrays of laser diodes 200 that provide features described herein. Such features of the device 700a, 700c may include, but are not limited to, broad field of view (in particular embodiments, about θ=120° horizontal by φ=10° vertical, or broader); long range (in some instances, greater than about 200 m); high resolution (in particular embodiments, about 0.1° horizontal and vertical) compact size defined by reduced dimensions (in particular embodiments, about 110× 40×40 mm); high power (in particular embodiments, about 10,000 w peak, pulsed); and eye safety (in particular embodiments, dispersed optical power can support eye safe, high power, 905 nm (e.g., GaAs) and/or about 1500 nm (e.g., InP) emitters).

Figure 7B:
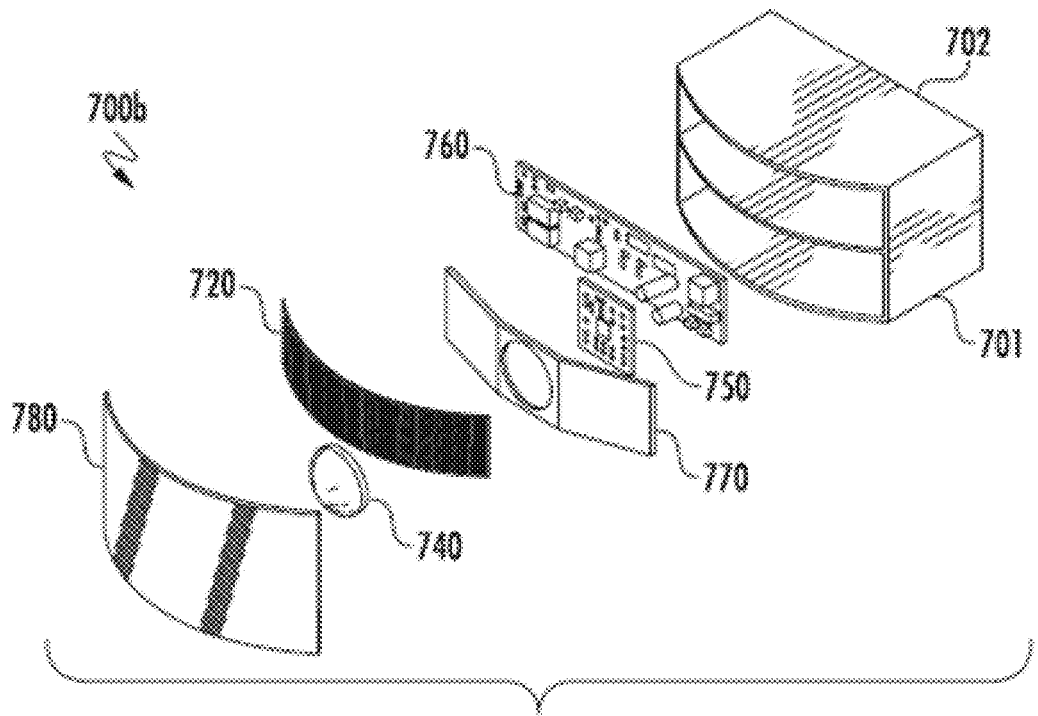
FIG. 7B is an exploded view illustrating example components of the LIDAR device of FIG. 7A.
Figure 7C:
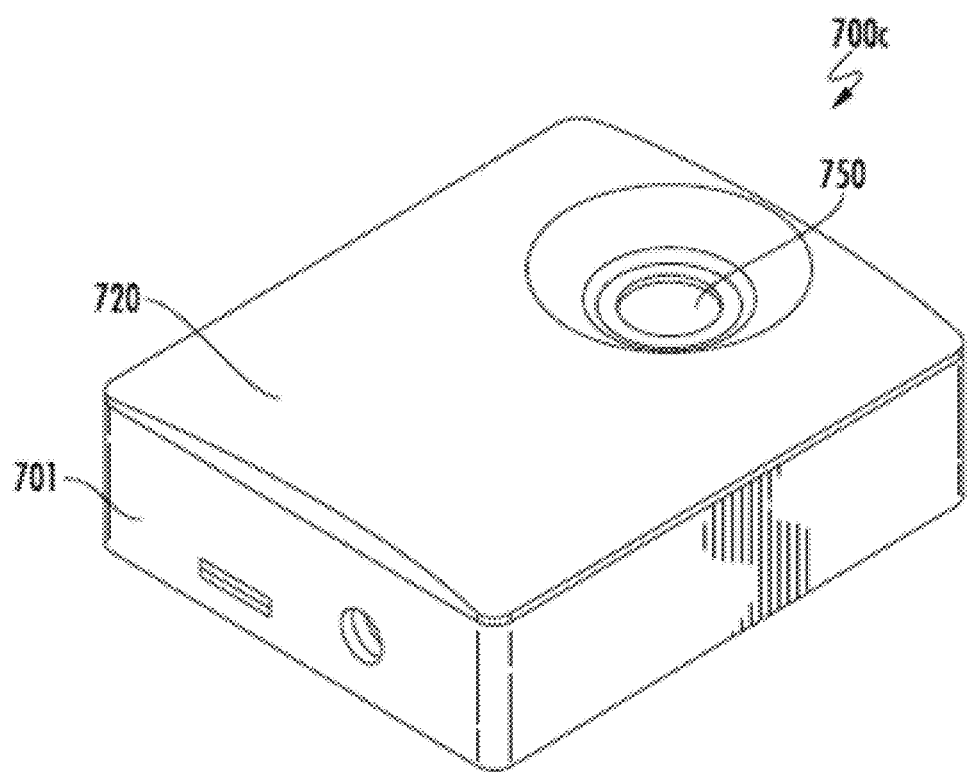
FIG. 7C is a perspective view illustrating another example LIDAR device in accordance with some embodiments described herein.

FIG. 7B is an exploded view 700b illustrating components of the LIDAR device 700a of FIG. 7A. As shown in FIG. 7B, the device housing or enclosure 701 includes a connector 702 for electrical connection to a power source and/or other external devices. The enclosure 701 is sized to house a light emitter array 720, a light detector array 730, electronic circuitry 760, detector optics 740 (which may include one or more lenses and/or optical filters), and a lens holder 770. A transparent cover 780 is provided to protect the emitter array 720 and detector optics 740, and may include beam shaping and/or filtering optics in some embodiments.

The light emitter array 720 may be a pulsed laser array, such as any of the VCSEL arrays 300a, 300b, 600 described herein. As such, the light emitter array 720 may include a large quantity (e.g., hundreds or even thousands) of distributed, ultra small laser diodes 200, which are collectively configured to provide very high levels of power (by exploiting benefits of the large number of very small devices). Using a large number of small devices rather than a small number of large devices allows devices that are very fast, low power and that operate at a low temperature to be integrated in an optimal configuration (with other devices, such as transistors, capacitors, etc.) to provide performance not as easily obtained by a small number of larger laser devices. As described herein the laser diodes 200 may be transfer printed simultaneously onto a non-native curved or flexible substrate in some embodiments. Beam shaping optics that are configured to project high aspect ratio illumination from the light emitter array 720 onto a target plane may also be provided on or adjacent the light emitter array 720.

The light detector array 730 may include one or more optical detector devices, such as pin, pinFET, linear avalanche photodiode (APD), silicon photomultiplier (SPM), and/or single photon avalanche diode (SPAD) devices, which are formed from materials or otherwise configured to detect the light emitted by the light emitter array 720. The light detector array 730 may include a quantity of optical detector devices that are sufficient to achieve a desired sensitivity, fill factor, and resolution. In some embodiments, the light detector array 730 may be fabricated using micro-transfer printing processes as described herein. The detector optics 740 may be configured to collect high aspect ratio echo and focus target images onto focal plane of the light detector array 730, and may be held on or adjacent the light detector array 730 by the lens holder 770.

The electronic circuitry 760 integrates the above and other components to provide multiple return LIDAR point cloud data to data analysis. More particularly, the electronic circuitry 760 is configured to control operation of the light emitter array 720 and the light detector array 730 to output filtered, high-quality data, such as 3D point cloud data, to one or more external devices via the connector 702. The external devices may be configured to exploit proprietary and/or open source 3D point cloud ecosystem and object classification libraries for analysis of the data provided by the LIDAR device 700a, 700c. For example, such external devices may include devices configured for applications including but not limited to autonomous vehicles, ADAS, UAVs, industrial automation, robotics, biometrics, modeling, augmented and virtual reality, 3D mapping, and/or security.

Figure 8:
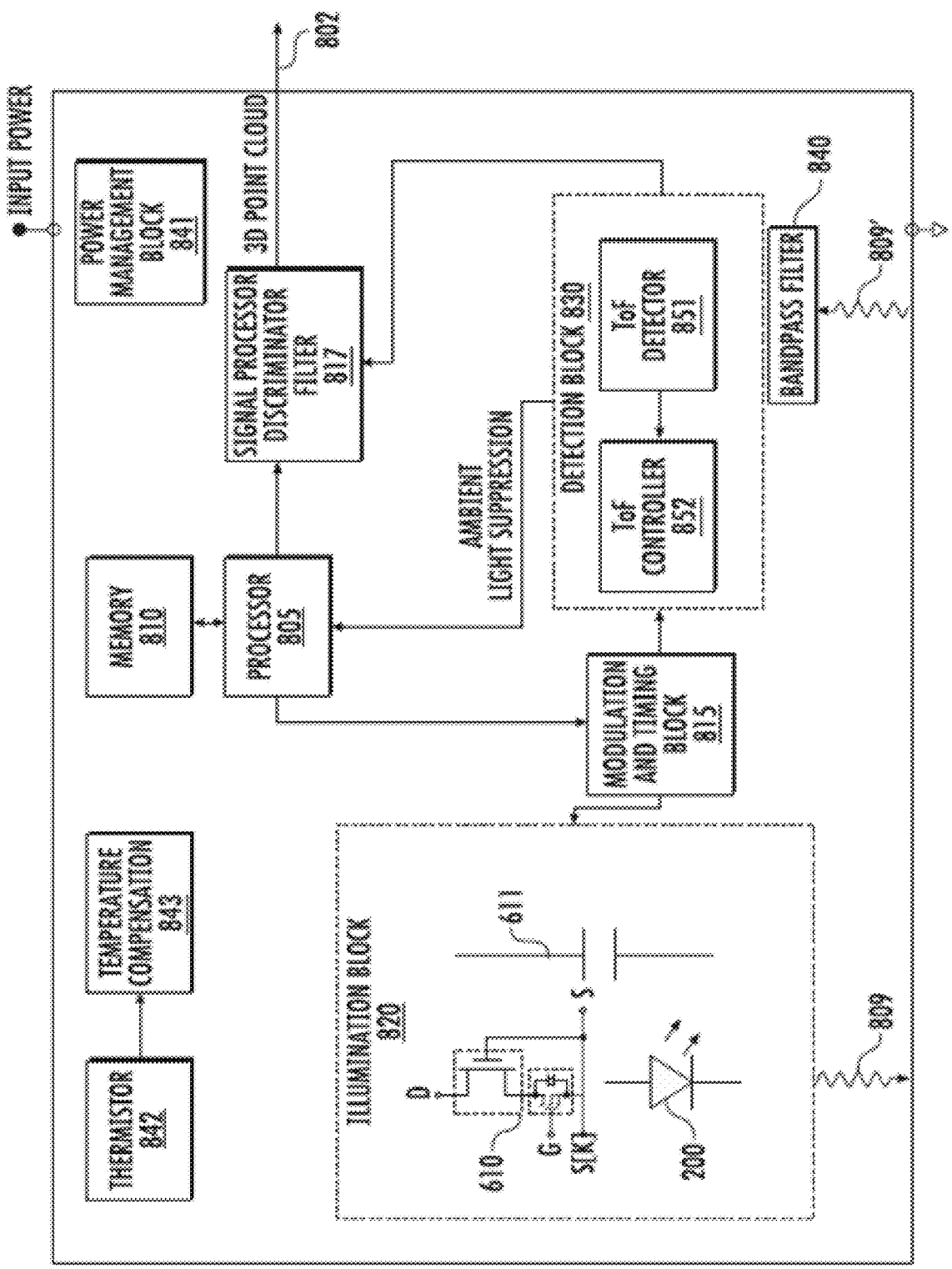
FIG. 8 is a block diagram illustrating an example system architecture for a LIDAR device in accordance with some embodiments described herein.

FIG. 8 is a block diagram illustrating an example system 800 for a LIDAR device, such as the LIDAR device 700a, 700b, 700c of FIGS. 7A-7C, in accordance with some embodiments described herein. As shown in FIG. 8, the system 800 integrates multiple electrically coupled integrated circuit elements to provide the LIDAR device functionality described herein. In particular, the system 800 includes a processor 805 that is coupled to a memory device 810, an illumination circuit 820, and a detection circuit 830. The memory device 810 stores computer readable program code therein, which, when executed by the processor, operates the illumination circuit 820 and the detection circuit 830 to collect, process, and output data, such as 3D point cloud data, indicative of one or more targets in the operating environment. The system 800 may further include a thermistor 842 and associated temperature compensation circuit 843, as well as a power management circuit 841 that is configured to regulate voltage or power to the system 800.

The illumination circuit 820 includes an array of discrete surface-emitting laser diodes 200, driver transistor(s) 610, and associated circuit elements 611, electrically connected in any of various configurations. In some embodiments, the illumination circuit 820 may be a laser array including rows and/or columns of VCSELs 200, such as any of the VCSEL arrays 300a, 300b, 600 described herein. Operation of the illumination circuit 820 to emit light pulses 809 may be controlled by the processor 805 via a modulation and timing circuit 815 to generate a pulsed light output 809. Beam-shaping and/or focusing optics, such as the lens arrays shown in FIGS. 11A-14C, may also be included in or adjacent the array of laser diodes 200 to shape and/or direct the light pulses 809.

The detection circuit 830 may include a time-of-flight (ToF) detector 851 coupled to a ToF controller 852. The ToF detector 851 may include one or more optical detector devices, such as an array of discrete pin, pinFET, linear avalanche photodiode (APD), silicon photomultiplier (SPM), and/or single photon avalanche diode (SPAD) devices. The ToF controller 852 may determine the distance to a target by measuring the round trip ("time-of-flight") of a laser pulse 809' reflected by the target and received at the ToF detector 851. In some embodiments, the reflected laser pulse 809' may be filtered by an optical filter 840, such as a bandpass filter, prior to detection by the ToF detector 851. The output of the detection block 830 may be processed to suppress ambient light, and then provided to the processor 805, which may perform further processing and/or filtering (via signal processor discriminator filter 817, and may provide the filtered output data (for example, 3D point cloud data) for data analysis. The data analysis may include frame filtering and/or image processing. In some embodiments, the data analysis may be performed by an external device, for example, an autonomous vehicle intelligence system.

FIG. 9 is a cross-sectional view illustrating an example laser diode array 900 including edge-emitting laser diodes 910 in accordance with further embodiments described herein. As shown in FIG. 9, a laser diode 910 includes an active region 905 (which may include one or more quantum wells) for generation and emission of coherent light 909. The active region 905 is provided between p-type and n-type layers 901 and 902, with contacts 912 and 911 thereon, respectively. A diffraction grating layer may be included to provide feedback for lasing. The optical cavity axis of the laser diode 910 is oriented perpendicular to the direction of current flow, defining an edge-emitting device, so that the radiation 909 emerges from the edge of the device 910 rather than from a top surface thereof. The devices 910 may be assembled on a non-native substrate 907, for example, by micro-transfer printing, electrostatic adhesion, or other mass transfer techniques. Respective mirror elements (illustrated as micro-steering mirrors 913) may also be assembled on the substrate 907 (for example, by micro-transfer printing, electrostatic adhesion, or other mass transfer techniques), and oriented relative to the optical cavity axis of a laser diode 910 that is to be provided adjacent thereto, such that the radiation 909 from the laser diode 910 is reflected and ultimately emitted in a direction perpendicular to the substrate 907.

The substrate 907 may be rigid in some embodiments, or may be flexible in other embodiments, and electrically conductive thin-film interconnects may be formed to electrically connect respective contacts of the laser diodes 910 in series and/or parallel configurations, at spacings similar to those described with reference to the arrays 300a, 300b, and/or 600 herein. Likewise, as described above with reference to the examples of FIGS. 6A-6C, the array 900 may include other types of devices and/or devices formed from different materials (e.g., power capacitors, FETs, micro-lens arrays, etc.) integrated with the laser diodes 910 on the substrate 907 at the spacings described herein.

Further embodiments described herein are directed to emitter arrays including beam shaping structures that can be configured to output arbitrary distributions of light intensity as a function of field of view angle using light that originates from multiple discrete laser diodes of the array. In some embodiments, respective laser diodes of the array are arranged on a surface of a non-native substrate with different relative orientations, such that the coherent light emission from the respective laser diodes is output in different directions (e.g., corresponding to azimuth or elevation angles) based on the different orientations. Beam shaping structures in accordance with embodiments described herein may generate incoherent output light. That is, while the respective light emissions from the individual laser diodes are coherent, the light output beam from the array includes a combination or superposition of the respective emissions that may be incoherent, as the phase of the light emission from one of the laser diodes can be independent of that from another. For example, embodiments described herein may include widening the horizontal and/or vertical field of view, and/or may provide local maxima or minima of intensity in specific directions. In some embodiments, a micro-transfer printing process (or other micro-assembly process) may be used to arrange the individual laser diodes on the non-native substrate with different relative orientations. In contrast, laser diodes on a native substrate may be defined with fixed or uniform orientations relative to one another.

Some advantages of incoherent superposition of respective laser diode emissions as described herein may include an absence or lack of speckle patterns that may be caused by interference of the monochromatic light emissions from the respective laser diodes of the array. Some LIDAR application detection schemes may include incoherent/direct energy detection (which may measure amplitude changes of the reflected light), or coherent detection (which may measure Doppler shifts, or changes in phase of the reflected light). Although described primarily with reference to embodiments in which the laser diodes are implemented as surface-emitting laser diodes (such as the VCSELs 200 of FIGS. 2A-2C), it will be understood that edge-emitting laser diodes (such as the edge-emitting laser diodes 910 and mirror structures 913 of FIG. 9) may be also be used in addition to or instead of the illustrated VCSELs 200 in distributed VCSEL arrays 300 with the beam shaping structures according to embodiments described herein, as shown for example in FIGS. 10A-15E.

Figure 10A:
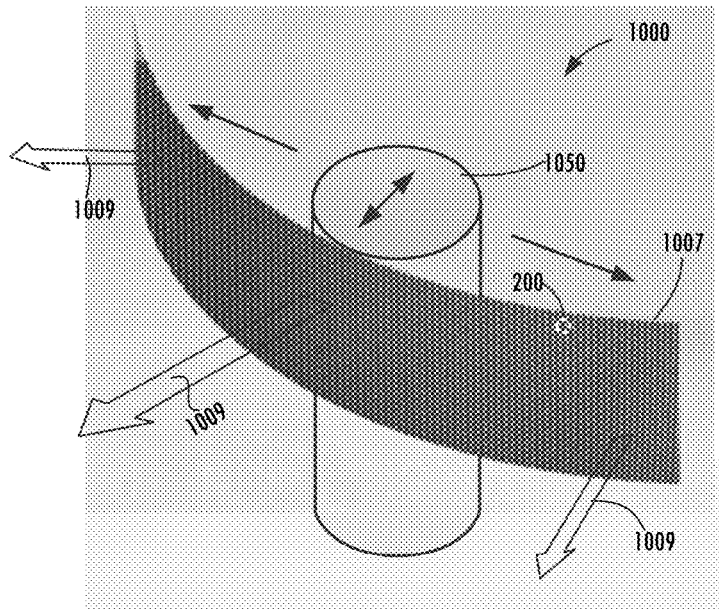
FIG. 10A is a perspective view illustrating a distributed emitter array including laser diodes on a curved substrate in accordance with some embodiments described herein.

FIG. 10A is a perspective view illustrating a distributed emitter array 1000 including laser diodes (illustrated as VCSELs 200) on a curved substrate 1007 in accordance with some embodiments described herein. The curvature of the substrate 1007 provides the respective VCSELs 200 of the array 1000 with different orientations relative to one another, such that their respective lasing apertures, optical axes (210, 208 in FIG. 2B), and coherent light emission are oriented in different directions to provide incoherent output beam 1009. The curvature may be implemented using a flexible substrate, such as the substrate 307b of FIG. 3B. Some example materials for the substrate 1007 that may have characteristics sufficient for the curvature or other deformation described with reference to FIGS. 10A-10D may include (but are not limited to) willow glass, thin zirconia ($ZrO_2$) ceramics, thin alumina ($Al_2O_3$) ceramics, silicon (Si), metals (aluminum, copper, etc.), and/or plastics/acrylates.

As shown in FIG. 10A, curvature of the substrate 1007 may be controlled in accordance with embodiments described herein such that the output beam 1009 provides a desired uniform or non-uniform angular power distribution, also referred to herein as an intensity distribution (energy per unit area) or photon flux distribution (photons per unit area). The curvature of the substrate 1007 may or may not be constant radius, and can thereby be designed or otherwise selected to provide the desired angular power distribution. For example, the substrate 1007 may define a cylindrical, acylindrical, spherical, or aspherical curve whose normal surfaces provide the distribution of relative amounts of power in the output beam 1009. An example non-uniform angular power distribution 1003 of the beam 1009 that may be output from the array 1000 is shown in FIG. 10B. Although illustrated in FIG. 10B with reference to the azimuth angle θ, it will be understood that the non-uniform angular power distribution 1003 may correspond to an azimuth or elevation angle, depending on the axis of curvature of the substrate 1007.

To determine the curvature corresponding to a desired photon flux distribution, such as the angular power distribution 1003 shown in FIG. 10B, line segments may be defined between control points. The line segments may have a length that is proportional to the relative amount of power at the angle normal to that segment. A spline may be fit through the control points to determine or otherwise define a profile 1004, as shown for example in the graph of FIG. 10C. The determined profile 1004 may define an aspherical or acylindrical curve whose normal surfaces provide required distribution of relative amounts of power 1003, as shown for example in FIG. 10B. The flexible substrate 1007 may thereby be bent or deformed based on the determined profile 1004, as shown for example in FIG. 10A. Additionally, the VCSELs 200 may be arranged on the non-native substrate 1007 at different and/or non-uniform pitches to aid in providing a desired far-field output light pattern 1009.

In some embodiments, the curvature of the substrate 1007 may be dynamically altered by mechanical or electro-mechanical actuation. For example, as shown in FIG. 10A, one or more controllable mandrels 1050 may be configured to move in one or more planes of motion along the substrate 1007 responsive to control signals from a control circuit, such that the positioning of the mandrel(s) 1050 is configured to deform the substrate 1007 to provide the desired curvature. In some embodiments, the mandrel(s) 1050 may be used to dynamically bend the flexible substrate 1007 to increase or decrease its curvature based on the profile 1004 of FIG. 10C, to define a desired aperture shape and non-uniform angular power distribution 1003 of FIG. 10B (e.g., more photons output forward than at edges). The deformation of the substrate 1007 can be performed dynamically in response to changing environmental conditions, such that the the field-of-view covered by the light emission from the array 1000 may be varied. The mandrel(s) 1050 can also serve as a heat sink in some embodiments. Also, as mentioned above, a spatial density or concentration of VCSELs 200 at peripheral portions of the array 1000 may be less than a concentration of VCSELs 200 at a central portion of the array 1000 in some embodiments.

The curvatures of the array substrate 1007 shown and described with reference to FIGS. 10A-10C may be based on providing the output beam 1009 with greater power distribution in particular direction(s) or angle(s) based on a distance and/or direction of desired operation, such that greater intensity may provide greater operating distance. In some embodiments, the greater operating distance may be desired to be straight ahead (e.g., corresponding to a forward direction of travel), and the array 1000 may be deformed such that more of the laser diodes are oriented in the forward direction to provide the output beam 1009 with greater photon flux distribution in the forward direction as compared to directions that are peripheral to a forward direction of travel.

Figure 10D:
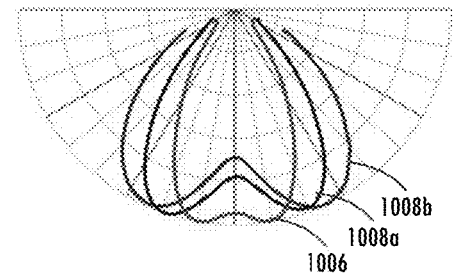
FIG. 10D is a graph illustrating an example angular power distribution output from a distributed emitter array including laser diodes on a curved substrate in accordance with further embodiments described herein.
Figure 10B:
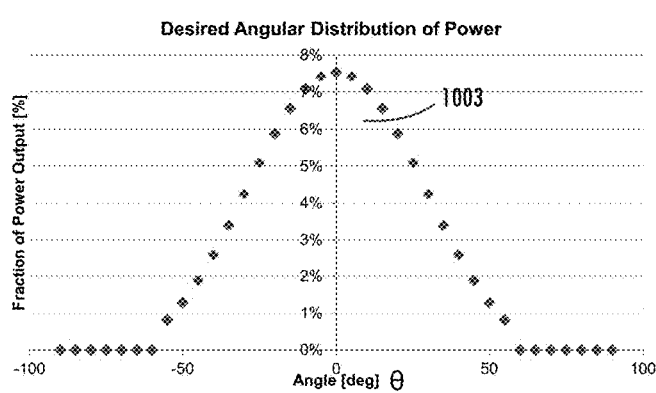
FIG. 10B is a graph illustrating an example angular power distribution output from a distributed emitter array including laser diodes on a curved substrate in accordance with some embodiments described herein.
Figure 10C:
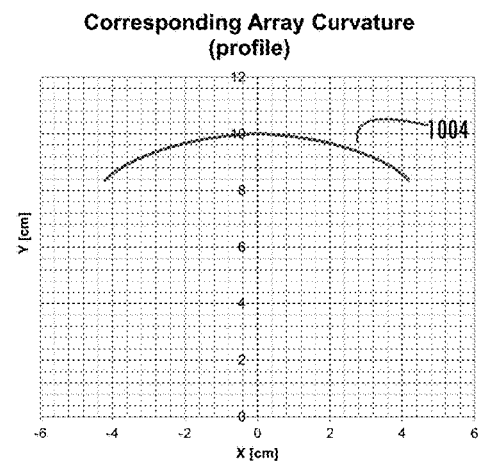
FIG. 10C is a graph illustrating an example curvature of the substrate of the distributed emitter array of FIG. 10A to provide the angular power distribution output of FIG. 10B in accordance with some embodiments described herein.

However, in other embodiments described herein, it may be desirable to provide the output beam 1009 with greater intensity toward the periphery of the array 1000 (e.g., toward the left or right side of the array 1000 rather than at the center), as shown for example, in the graph of FIG. 10D. For instance, in some applications, one or more dedicated sensors/sensor arrays may be used for the forward direction of travel (e.g., for longer range sensing along a road, which may correspond to profile 1006), and the array 1000 may be an additional sensor array that is configured to provide greater resolution in one or more directions that are peripheral to the forward direction of travel. As such, the array 1000 may be bent according to the profiles 1008a or 1008b shown in FIG. 10D, which provide the output beam 1009 with greater angular power distributions in directions peripheral to the straight ahead/forward direction of the array 1000. The embodiments of FIGS. 10A-10D have been described with reference to control of the curvature of the substrate 1007 in a single dimension (shown as the "horizontal" direction) to provide varying angular power distributions over a field of view of up to about 180 degrees or more. However, it will be understood that curvature control in embodiments described herein is not limited to a single dimension, and thus some embodiments may include mechanical and/or electro-mechanical actuators that are configured to deform the substrate 1007 in multiple dimensions (e.g., in both horizontal and vertical directions), thereby affecting both azimuth (horizontal divergence) and elevation (vertical divergence) of the output beam 1009. Moreover, in some embodiments an array of driver transistors (such as the driver transistors 610 of FIGS. 6A-6C) may be assembled on the substrate 1007 and used to dynamically adjust or otherwise control the operation and/or emission power of individual VCSELs 200 or subsets of the VCSELs 200 in different areas of the array 1000, for control of the angular power distribution alone or in combination with control of the curvature of the substrate 1007. The driver transistors 610 may also be used to sequentially activate columns and/or rows of VCSELs 200 to provide electronic beam scanning over the angular power distribution defined by the curvature of the substrate 1007. Furthermore, control of the curvature of the substrate 1007 may be used in conjunction with any of the lens arrays 1103a-1103c, 1203, 1303e, 1403a-1403c described herein with reference to FIGS. 11A-14C, as well as the tilted laser diode arrangements of FIGS. 15A-15F.

Figure 11A:
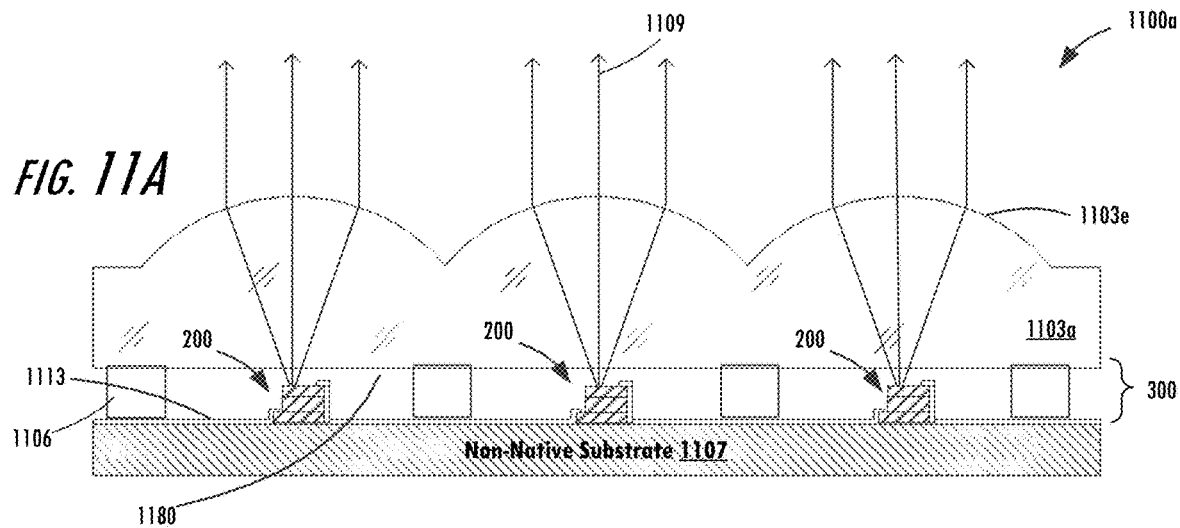
FIGS. 11A, 11B, and 11C are cross-sectional views illustrating example distributed emitter arrays including shaped lenslet arrays that are configured for high-aspect ratio beam forming in accordance with some embodiments described herein.
Figure 11B:
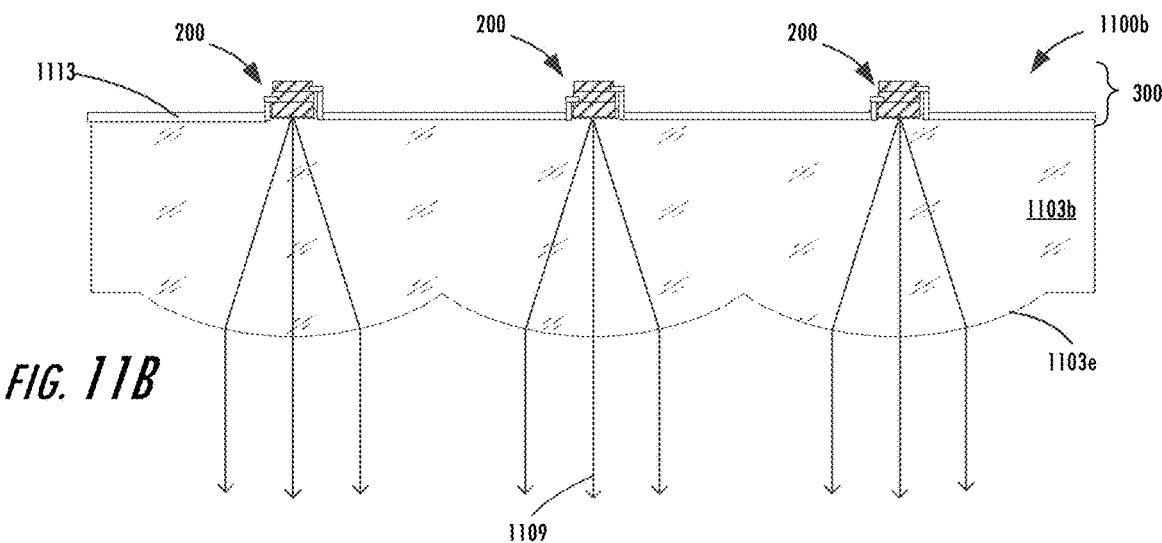
Figure 11C:
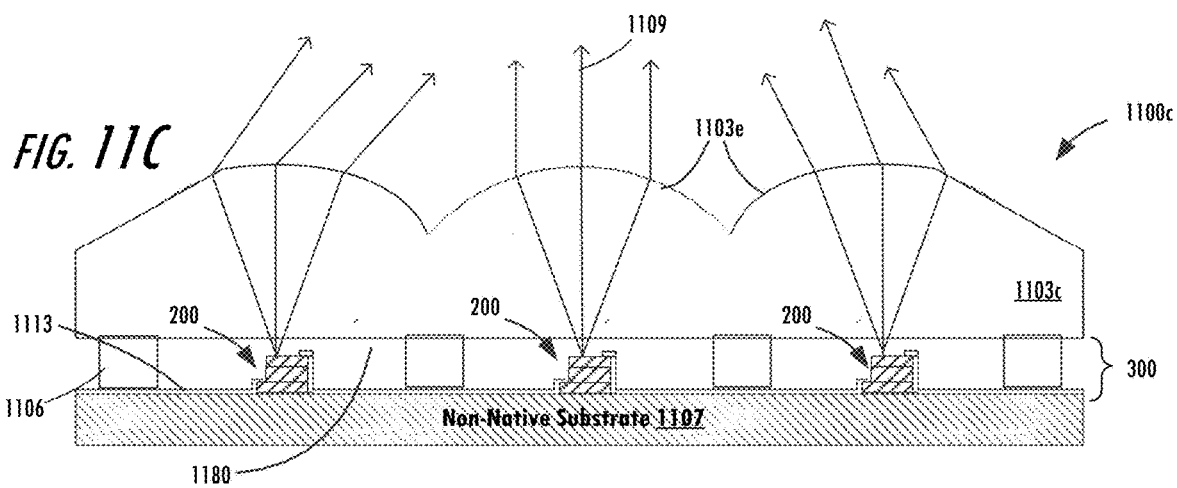

FIGS. 11A, 11B, and 11C are cross-sectional views illustrating example distributed emitter arrays with integrated optics 1100a, 1100b, and 1100c including shaped lenslet arrays that are configured for high-aspect ratio beam forming in accordance with some embodiments described herein. As shown in FIGS. 11A-11C, the arrays 1100a, 1100b, and 1100c include optical elements in the form of lenslet array 1103a, 1103b, and 1103c, a plurality of laser diodes (illustrated as VCSELs 200) assembled and electrically connected in strings to define respective rows and/or columns of VCSEL arrays 300, and electrically conductive interconnects 1113 that define the electrical connections between the VCSELs 200. The VCSELs 200 may be assembled on a non-native substrate 1107 (in FIGS. 11A and 11C) or on a surface of the lenslet array 1103b (in FIG. 11B) by micro-transfer printing, electrostatic adhesion, or other mass transfer techniques. For example, micro-transfer printing may achieve inter-VCSEL spacings of less than about 150 micrometers (μm), or in some embodiments, less than about 100 μm, or less than about 50 μm, thereby increasing the active area fill factor as compared to some conventional VCSEL arrays.

The substrate 1107 may be rigid or flexible. Some example materials for the substrate 1107 that may have characteristics sufficient for the curvature or other deformation described herein may include (but are not limited to) willow glass, thin zirconia ($ZrO_2$) ceramics, thin alumina ($Al_2O_3$) ceramics, silicon (Si), metals (aluminum, copper, etc.), and/or plastics/acrylates.

The lenslet arrays 1103a, 1103c include a gap or interface 1180 in respective emission paths 1190 between the respective lens elements 1103e (also referred to herein as lenslets) and corresponding ones of the VCSELs 200, which are aligned with the respective lens elements 1103e. The interface 1180 may be defined by one or more spacer structures 1106 that attach or otherwise integrate the lenslet arrays 1103a, 1103c onto the surface of the substrate 1107 and separate the lenslet array 1103a from the surface of the substrate 1107 based on the focal lengths of the lenslets 1103e. In some embodiments, the spacer structures 1106 may be formed of a transparent material, such as silicone, and may be implemented as spaced apart spacer structures 1106 defining respective air gaps therebetween, or as a continuous transparent material layer that fills the space between the VCSELs 200 and the lenslet arrays 1103a, 1103c. In some embodiments, the lenslet arrays 1103a, 1103c may be formed of a glass lens element, or a silicone-on-glass lens element.

Light 1109 output from the respective VCSELs 200 may be collected by lenslets 1103e of the lenslet arrays 1103a, 1103c, thus resulting in the generation of multiple collimated light beams. Collimation can be achieved with microlens arrays 1103a, 1103b having the same pitch as the VCSEL array 300, i.e. lenslet 1103e per VCSEL 200. Curvature of the substrate 1107 and/or the lenslet arrays 1103a, 1103c may be determined and used as discussed above with reference to FIGS. 10A-10D to provide the output light from the array at various angles, for emission of non-collimated beams (e.g., for horizontal and/or vertical divergence). In some embodiments, the lens elements 1103e may be defined in the surface of the lenslet arrays 1103a, 1103b, 1103c by a molding, casting, embossing, and/or etching process.

FIG. 11B illustrates an example distributed emitter array 1100b according to further embodiments described herein in which the VCSELs 200 are integrated directly onto the surface of the lenslet array 1103b, such that the respective emission paths 1190 between the respective lens elements 1103e are free of gaps or air interfaces, providing a monolithic lenslet/emitter array structure. The thickness of the lenslet array 1103b may be selected to effectively function as a spacer structure for the entirety of the lenslet array 1103b, to position the VCSELs 200 at a distance at or near the focal length of the individual lenslets 1103e. As such, the surface of the lenslet array 1103b functions as a non-native substrate. In some embodiments, the lenslet array 1103b may be formed of a glass lens element on a silicone layer, or may be formed solely of silicone (e.g., molded silicone) or from a layer of gradient index material (which provide different refractive indices by changing the loading fraction of high index nanoparticles). That is, the lenslet array 1103b may provide the non-native substrate for the VCSELs 200.

FIGS. 11A and 11B illustrate example lenslet arrays 1103a, 1103b including similar plano-convex (PCX) lenses as the lenslet elements 1103e, which may provide collimated light output. However, in some embodiments as shown in in FIG. 11C, the shapes of the lenslets 1103e may vary independently of one another in one or more directions, such that the output beams 1109 from the lens array 1103c are non-collimated. For example, with reference to an X-Y plane defined by the surface of the substrate 1107, the shape of the lenslets 1103e at ends of the array 1103c may differ from the lenslet 1103e therebetween in the X-direction, to provide output light 1109 with differently shaped far field patterns along the X-direction (which may correspond to a horizontal divergence). The translationally symmetric design of the lenslets 1103e shown in FIG. 11C can be used to spread the output light 1109 in one direction (e.g., the X-direction), but not affect the spreading in another direction (e.g., the Y-direction). However, it will be understood that the shapes of the lenslets 1103e may likewise vary in the Y direction, in order to provide output light 1109 with differently shaped far field patterns along the X- and/or the Y-axes. More generally, the lens prescription can vary from lenslet to lenslet 1103e across the array 1103c in order to realize a desired far field pattern. The lenslet arrays 1103a, 1103b, 1103c may be formed of a flexible lens material such that the lenslet arrays 1103a, 1103b, 1103c can also be bent or deformed to provide a desired curvature profile, as discussed above with reference to FIGS. 10A-10D, such that the output light 1109 from the arrays 1100a, 1100b may provide a desired angular power distribution.

Figure 12A:
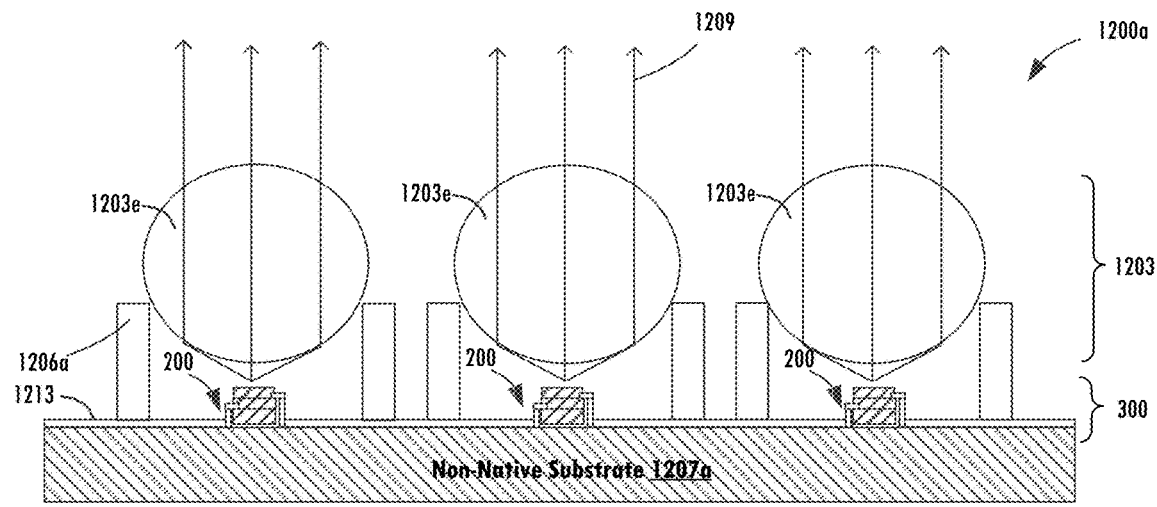
FIGS. 12A and 12B are cross-sectional views illustrating example distributed emitter arrays including a self-aligned ball lens arrays that are configured for wide field-of-view beam forming in accordance with some embodiments described herein.
Figure 12B:
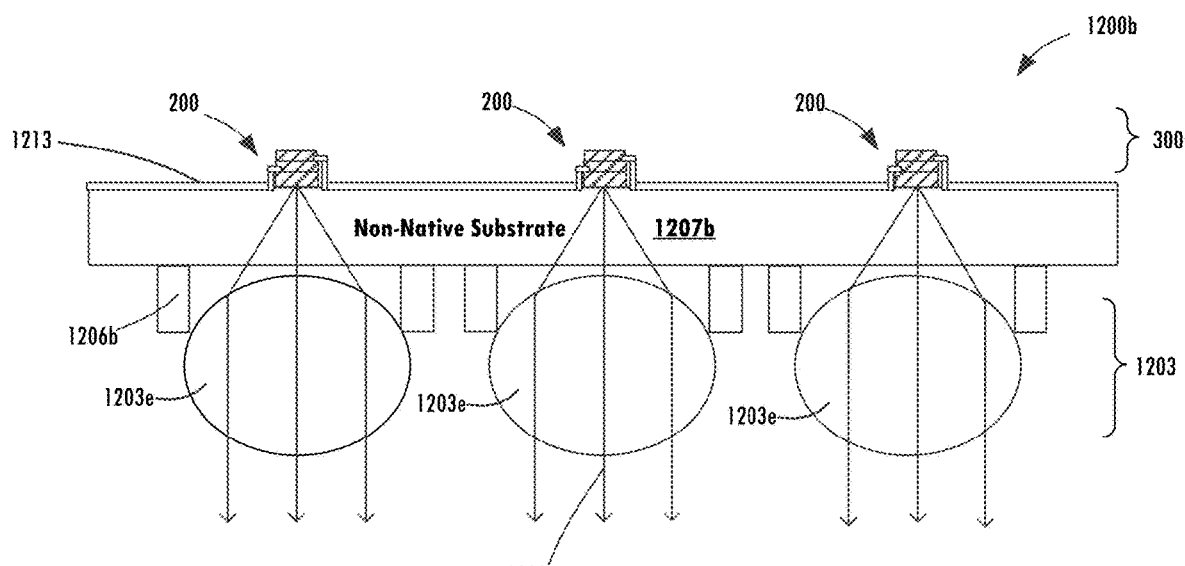

Although illustrated in FIGS. 11A-11C as single-stage designs, in some embodiments, the arrays 1100a, 1100b, 1100c may include multi-stage optics, with the illustrated arrays of optics 1103a, 1103b, 1103c aligned with and configured to receive light 1109 from an array of primary optics, such as the ball lenses shown in FIGS. 12A-12B. Such a multi-stage design can provide greater flexibility and performance, for example, by using one stage of the multi-stage optics to provide horizontal divergence of the output light emission, and the next stage to provide vertical divergence of the output light emission, or vice versa.

FIGS. 12A and 12B are cross-sectional views illustrating example distributed emitter arrays with integrated optics 1200a and 1200b, including a self-aligned ball lens arrays 1203 that are configured for wide field-of-view beam forming in accordance with some embodiments described herein. Optical alignment of a ball lens to a VCSEL may conventionally utilize active alignment, whereby the ball lens may be moved in x, y, and z space while monitoring the far field pattern for optimal coupling. This alignment process can be slow and expensive, particularly for large arrays of VCSELs that may require tens/hundreds/thousands of ball lenses to collimate each laser beam emitted by the array.

Some embodiments described herein may achieve optical alignment of a ball lens to a VCSEL using a self-aligned method, for example, using alignment features (such as photolithographically-defined features) to allow respective ball lens elements 1203e to self-align in x, y, and z space. For example, as shown in FIGS. 12A and 12B, the arrays 1200a and 1200b include optical elements in the form of ball lens arrays 1203, a plurality of laser diodes (illustrated as VCSELs 200) assembled and electrically connected in strings to define respective rows and/or columns of emitter arrays 300, and electrically conductive interconnects 1213 that define the electrical connections between the VCSELs 200. The VCSELs 200 may be assembled on a non-native substrate 1207a and 1207b by micro-transfer printing, electrostatic adhesion, or other mass transfer techniques. The substrates 1207a, 1207b may be rigid or flexible, and may be formed from (but are not limited to) willow glass, thin zirconia ($ZrO_2$) ceramics, thin alumina ($Al_2O_3$) ceramics, silicon (Si), metals (aluminum, copper, etc.), and/or plastics/acrylates.

In the embodiment of FIG. 12B, the VCSELs 200 are formed on a backside of the substrate 1207b, which is formed of a material that is transparent to the wavelength range of the light 1209 emitted by the VCSELs 200. The substrate 1207b may have a thickness and/or refractive properties that affect the optical path of the light output from the VCSELs 200 such that the lens array 1203 is provided at a desired focal distance. Advantages of this configuration 1200b (also referred to herein as back- or bottom-illumination) may include protection or isolation of the VCSELs 200 from processing conditions (e.g., temperature, chemicals, etc.) used in fabricating the optics 1203. The thickness of the substrate 1207b may also aid in collimation of the light output 1209, for example, as the optical path through the opposing surfaces of the substrate 1207b may provide additional refraction prior to entering the lens elements 1203e. In further embodiments, the substrate 1207b may have a thickness and/or refractive properties that may be sufficient to provide collimation of the light output 1209 without the need for further lens elements 1203e, that is, such that the lens array 1203 need not be present.

In FIGS. 12A and 12B, the non-native substrates 1207a and 1207b further include alignment features 1206a and 1206b on surfaces thereof. The spacing between pairs of the alignment features 1206a, 1206b may be sized and configured to suspend respective ball lens elements 1203e over respective VCSELs 200, such that a respective optical axis of each ball lens element 1203e is aligned with the optical axis defined by a lasing aperture of an underlying VCSEL 200.

In some embodiments, the ball lens elements 1203e may each have a respective diameter of about 250 μm or less, for compatibility with the dimensions of VCSEL-based VCSEL arrays 300 as described herein. To achieve precise alignment between the optical axes of such small ball lens elements 1203 and the VCSELs 200 described herein, the alignment features 1206a and 1206b may be photolithographically-defined in some embodiments. For example, the alignment features 1206a and 1206b may be formed from a dry-film resist layer that is photolithographically patterned to define holes therein, where the holes are sized and shaped to align the optical axes of ball lens elements 1203e of a predetermined diameter with the optical axis defined by the respective apertures of the VCSELs 200. It will be understood, however, that some applications (e.g., flash LIDAR) may be tolerant of missing or imperfect individual lens 1203e/VCSEL 200 optical axis alignment among the hundreds or thousands of lenses 1203e/VCSELs 200 in the arrays 1200a, 1200b, and that other materials may be used to define the alignment features 1206a and 1206b.

The alignment features 1206a and 1206b may also be sized to define sufficient gaps between each ball lens element 1203e and an underlying VCSEL 200 to provide desired collimation of the light 1209 output from the underlying VCSEL 200. Different materials may be selected for the alignment features 1206a and 1206b based on the size of the desired gaps (and the corresponding heights of the alignment features 1206a and 1206b), alone or in combination with additional features for supporting the ball lenses. In some embodiments, a transparent material may fill the gap between a lens element 1203e and the underlying VCSEL 200 (or likewise, the gap between lens arrays 1103a, 1103c and VCSELs 200). For example, the gap may be air, silicone, or another material that is transparent to the wavelength range of the light 1209 emitted by the VCSELs 200.

Some embodiments described herein may be of greater benefit in applications including very large arrays 1200a, 1200b on ultra-small dies, with ball lenses 1203e with diameters smaller than about 250 μm, for example in LIDAR applications. In some embodiments, micro-transfer-printing (MTP) may be used to print the array 1203 of pre-aligned ball lenses 1203e onto the VCSEL array 300. In further embodiments, BGA technology may be used for pre-alignment, where the ball lenses 1203e can be pre-aligned by pouring them onto a grid that has been photolithographically produced to define the ball lens array 1203, and the MTP stamp may pick-up the ball lens array 1203 from the pre-alignment grid and deposit the ball lens array 1203 on top of the VCSEL array 300 such that the ball lenses 1203e are aligned by the alignment features 1206a, 1206b. In some embodiments, the ball lens arrays 1203 of FIGS. 12A and 12B may be used in combination with an overlying lens array, such as the Fresnel lens 1403 of FIGS. 14A-14C, in order to further modify the field of view (e.g., the vertical divergence of the light output 1209).

FIGS. 13A and 13B are cross-sectional views and FIG. 13C is a perspective view illustrating example distributed emitter arrays with integrated optics 1300a, 1300b, and 1300c including offset ball lens arrays for beam forming in accordance with some embodiments described herein. As shown in FIGS. 13A-13C, the arrays 1300a, 1300b, 1300c include optical elements in the form of ball lens arrays, a plurality of laser diodes (illustrated as VCSELs 200) assembled and electrically connected in strings to define respective rows and/or columns of VCSEL arrays 300, and electrically conductive interconnects 1313 that define the electrical connections between the VCSELs 200. The VCSELs 200 may be assembled on non-native substrates 1307a, 1307b, 1307c by micro-transfer printing, electrostatic adhesion, or other mass transfer techniques. The substrates 1307a, 1307b, 1307c may be rigid in some embodiments, or flexible in other embodiments.

As shown in FIGS. 13A-13C, each lens element 1303e of the lens array is suspended over multiple VCSELs 200, such that the direction of light emission from each VCSEL 200 is offset relative to the optical axis of the respective lens element 1303e. For example, as shown in the enlarged cross-sections of FIGS. 13A and 13B, the non-native substrates 1307a and 1307b include alignment features 1306a and 1306b on surfaces thereof, where the spacing between pairs of the alignment features 1306a, 1306b is sized and configured to suspend respective ball lens elements 1303e over a 2×-2 sub-array of VCSELs 200 such that the optical axis of each ball lens element 1303e is misaligned with the respective optical axes defined by the lasing apertures of the underlying VCSEL 200s, and the lens element 1303e diffracts the light emission from the underlying VCSELs 200 into non-collimated beams 1309.

The examples of FIGS. 13A-13C are illustrated with reference to beams 1309 having increased horizontal and vertical divergence, as compared with the aligned lens elements 1203e of FIGS. 12A-12B. In some embodiments, the substrates 1307a, 1307b, 1307c may be curved to provide further horizontal and/or vertical divergence. For example, the substrates 1307a, 1307b, 1307c may be formed from (but are not limited to) willow glass, thin zirconia ($ZrO_2$) ceramics, thin alumina ($Al_2O_3$) ceramics, silicon (Si), metals (aluminum, copper, etc.), and/or plastics/acrylates. In the embodiment of FIG. 13B, the substrate 1307b is formed of a material that is transparent to the wavelength range of the light 1309 emitted by the VCSELs 200. The substrate 1307b may have a thickness and/or refractive properties that affect the optical path of the light output from the VCSELs 200 such that the lens elements 1303e are provided at a desired focal distance.

In the example of FIG. 13C, the array 1300c further includes integrated driver transistors 1310 that are assembled on the substrate 1307c adjacent to one or more of the VCSELs 200, for example, using a micro-transfer printing (MTP) process. For example, the array 1300c includes a plurality of 2×-2 sub-arrays of monolithic VCSELs 200 that are electrically connected in series (or anode-to-cathode) to define columns or other subsets of the array 1300c. The array 1300c further includes an array of driver transistors 1310, with each driver 1310 electrically connected in series with a respective column (or other subset) of 2×-2 sub-arrays of VCSELs 200. The driver transistors 1310 may also be used to sequentially activate columns and/or rows of VCSELs 200 to provide electronic beam scanning. The integration of the array of driver transistors 1310 with the sub-arrays of VCSELs 200 may otherwise be similar to the array 600 of FIGS. 6A-6C, and thus, further description will not be provided.

Figure 14A:
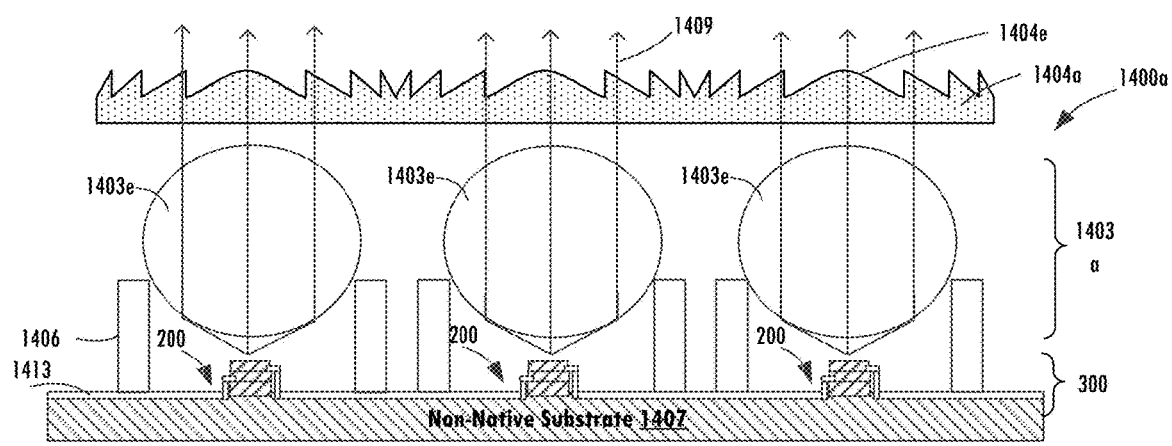
FIGS. 14A, 14B, and 14C are cross-sectional views illustrating example distributed emitter arrays including lens arrays having primary and secondary lens elements that are configured for multi-direction beam forming in accordance with some embodiments described herein.
Figure 14B:
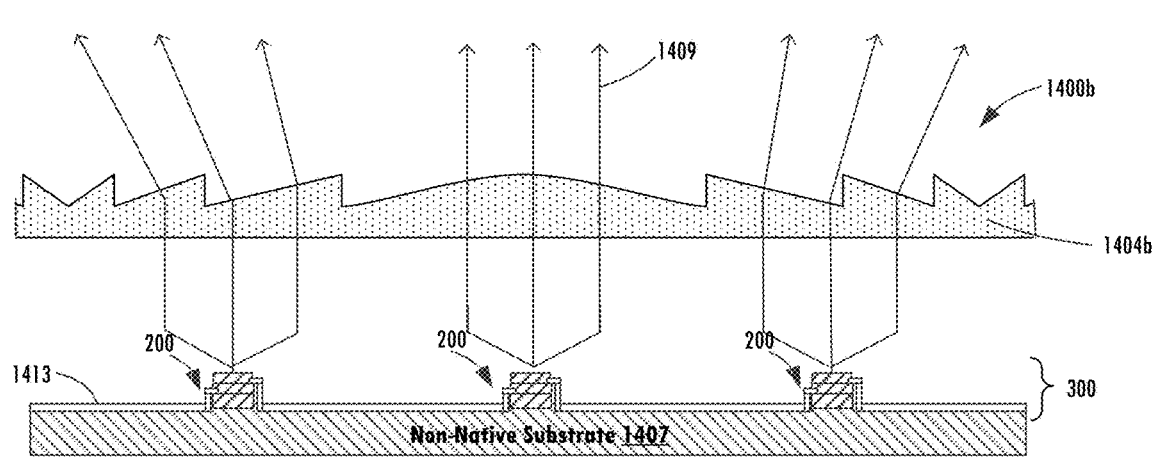
Figure 14C:
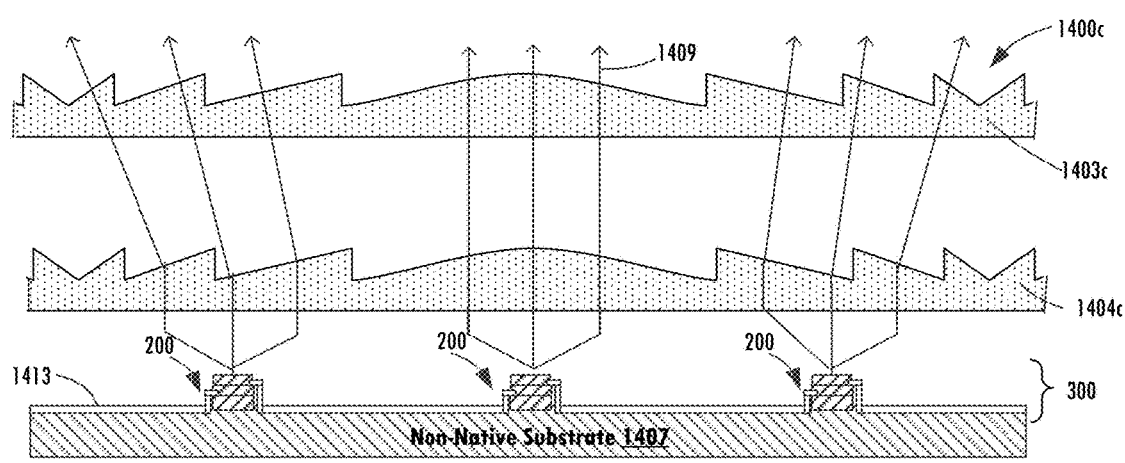

In some embodiments, the ball lens arrays of FIGS. 13A-13C may be used in combination with an overlying lens array, such as the Fresnel lens 1403 of FIGS. 14A-14C, in order to further modify the field of view (e.g., the vertical divergence of the light output 1309).

FIGS. 14A, 14B, and 14C are cross-sectional views illustrating example distributed emitter arrays with integrated optics 1400a, 1400b, and 1400c including lens arrays having primary and/or secondary lens elements that are configured for multi-direction beam forming in accordance with some embodiments described herein. The array 1400a of FIG. 14A includes a plurality of laser diodes (illustrated as VCSELs 200) assembled and electrically connected in strings to define respective rows and/or columns of VCSEL arrays 300, and electrically conductive interconnects 1413 that define the electrical connections between the VCSELs 200. The VCSELs 200 may be assembled on a non-native substrate 1407 by micro-transfer printing, electrostatic adhesion, or other mass transfer techniques. The substrate 1407 may be rigid or flexible, and may be formed from (but is not limited to) willow glass, thin zirconia ($ZrO_2$) ceramics, thin alumina ($Al_2O_3$) ceramics, silicon (Si), metals (aluminum, copper, etc.), and/or plastics/acrylates.

The embodiment of FIG. 14A includes a primary lens array 1403a including respective lens elements 1403e that are suspended over respective VCSELs 200 by alignment features 1406 that are sized, spaced, and configured to align a respective optical axis of each lens element 1403e with the optical axis defined by a lasing aperture of an underlying VCSEL 200. The lens elements 1403e may be ball lenses (such as spherical lenses) in some embodiments, or may be cylindrical lenses in some embodiments. The lens elements 1403e of the primary lens array 1403a may be configured to increase azimuth (horizontal divergence) of the output beam 1409 from the array 1400a.

Still referring to FIG. 14A, the array 1400a further includes a secondary lens array 1404a (illustrated as a Fresnel lens). The secondary lens array 1404a is configured to increase elevation (vertical divergence) of the output beam 1409, while substantially maintaining horizontal beam divergence (e.g., within <1 degree per column). In the example of FIG. 14A, the secondary lens array 1404a is implemented as a thin flexible linear Fresnel lens cover (including respective Fresnel lenslets 1404e) that is provided over the VCSEL array 300 and the primary lens array 1403a thereon, in order to diverge the emitted light from each VCSEL 200 by about 15 degrees to about 26 degrees vertically. In embodiments where the substrate 1407 is formed of a flexible material, the array 1400a may also be bent to achieve an overall horizontal Field-of-View (FoV) of up to about 150 degrees or more. However, the secondary lens element 1404a is not limited to a Fresnel lens; for example, the secondary lens element 1404a may be implemented by a flexible diffusing film in some embodiments.

As such, in some embodiments, light from each VCSEL 200 may be collimated to about 0.1 degree per column horizontally using a respective ball lens 1403e. In other embodiments, the light from each column of VCSELs 200 of the array 300 may be collimated using a cylindrical lens element 1403e to provide about 0.1 degree horizontal collimation. That is, the array 1400a of FIG. 14A utilizes a combination of primary lens elements (e.g., ball or cylindrical lenses 1403e) and secondary lens elements (e.g., Fresnel lens 1404a) to control horizontal and vertical divergence of the output laser beams 1409 from respective VCSELs 200.

The alignment features 1406 used to self-align the lens elements 1403e (whether ball or cylindrical) may be photolithographically defined, for example, from a dry-film resist layer that is patterned to define holes (for the ball lenses 1403e) or trenches (for the cylindrical lenses 1403e) therein. However, in other embodiments, the primary lens array 1403a may be omitted; for example, the secondary lens array 1404a may provide vertical divergence of the output beam 1409, with horizontal divergence provided by the curvature of the substrate 1407.

In the embodiment of FIG. 14A, the secondary lens array 1404a includes respective Fresnel lenslets 1404e, each of which has an optical axis that is aligned with those of the underling primary lens element 1403e and VCSEL 200. FIG. 14B illustrates alternate configuration of a distributed emitter array with integrated optics 1400b, which includes a large-area Fresnel lens array 1404b overlying the entire array 300 of VCSELs 200. That is, each VCSEL 200 is positioned beneath a different region of a single Fresnel aperture 1404b. In the example of FIG. 14B, the lens elements 1403e are omitted. As such, the large-area Fresnel lens array 1404b may provide vertical divergence of the output beam 1409, with horizontal divergence provided by curvature of the substrate 1407. The lens 1404b may be flexible (e.g., plastic) Fresnel lens in some embodiments. Also, as mentioned above, the lens array 1404b is not limited to a Fresnel lens array, but may be implemented by a flexible diffusing film in some embodiments.

A further embodiment of a distributed emitter array with integrated optics 1400c is shown in FIG. 14C, in which multiple layers of lens arrays 1403c, 1404c (illustrated as respective large-area Fresnel lenses) are used in sequence in order to realize a desired far field pattern of the output beam 1409. In the example of FIG. 14C, the lens array 1403c is used to affect the angle of laser emission in one dimension (e.g., horizontal divergence in an X-direction along the surface of the substrate 1407), while the lens array 1404c is used to affect the angle of laser emission in another dimension (e.g., vertical divergence in a Y-direction along the surface of the substrate 1407), or vice versa. That is, the arrays 1400a, 1400c include a stacked lens array structure whereby a first lens element 1403a, 1403c alters the far field pattern of the output beam 1409 in a first dimension, while a second lens element 1404a, 1404c alters the far field pattern of the output beam 1409 in a second dimension.

While illustrated in FIGS. 14A-14C with reference to embodiments in which the lens arrays 1403c, 1404a-c and VCSELs 200 are stacked on a surface of a substrate 1407, it will be understood that the substrate 1407 may be transparent to the wavelength range of the light output from the VCSELs 200 in some embodiments, and the VCSELs 200 may be arranged to transmit light through the transparent substrate (as shown in FIGS. 12B and 13B) to the lens arrays 1403c, 1404a-c.

FIGS. 14A-14C are also illustrated primarily with reference to arrays of Fresnel lenses 1404a, 1404b, 1403c, 1404c, which may be formed from materials having sufficient physical flexibility for integration with flexible substrate 1407 implementations, thereby allowing for adjustment of the curvature of the arrays 1400a, 1400b, 1400c in a manner similar to those described above with reference to FIGS. 10A-10D. However, it will be understood that embodiments described herein are not limited to such Fresnel lens arrays, and other flexible optical elements and/or micro-structured lenslets may be used to affect the far field pattern of the output beam 1409 by scattering the light from the laser diodes 200. For example, one or more of the lens arrays 1404a, 1404b, 1403c, 1404c may be implemented by incoherent micro-optical scattering diffusers, such as those made by Brightview technologies and Luminit. Embodiments described herein may utilize these and/or other optical elements for the modification of far field patterns of VCSEL arrays, for example, in LIDAR applications.

Figure 14D:
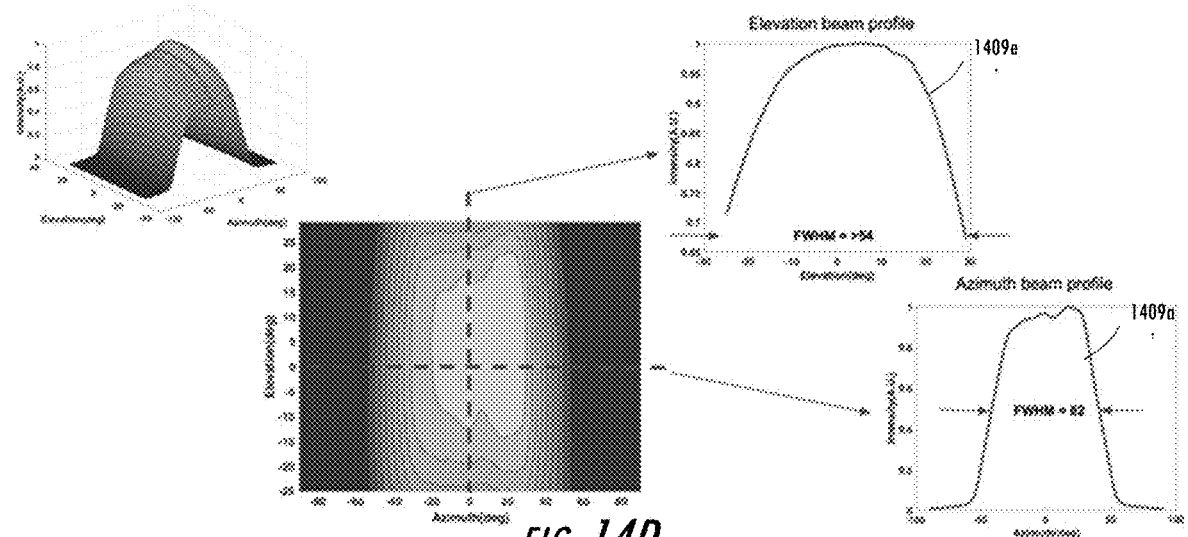
FIGS. 14D and 14E are graphs illustrating effects of an optical diffusing film on beam forming of distributed emitter arrays in accordance with some embodiments described herein.
Figure 14E:
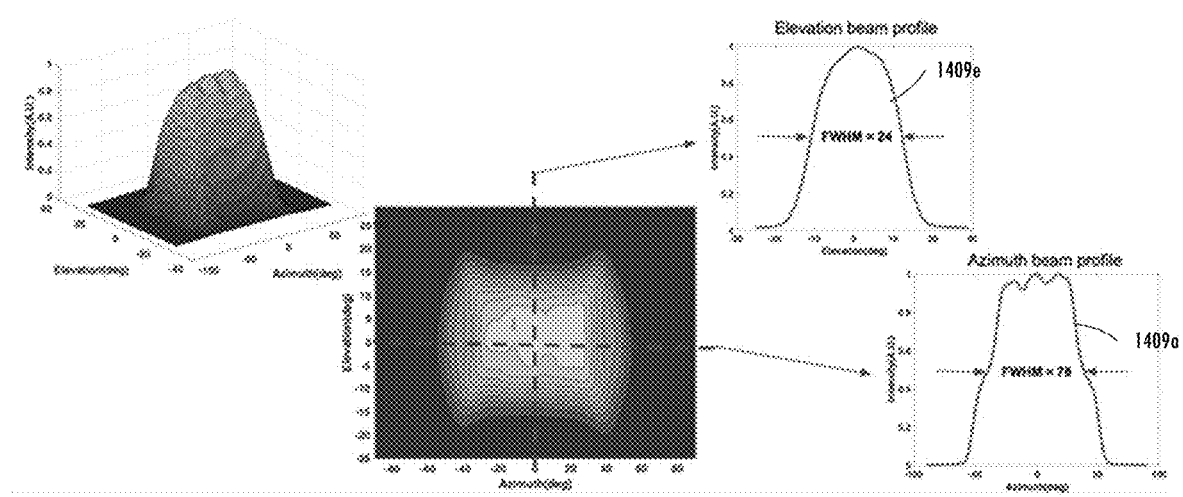

Results illustrating the output beams provided by flexible optical diffusers on VCSEL arrays to modify FoV are illustrated in FIG. 14D, as compared to the absence of such optical diffusers in FIG. 14E. The arrangement of these optical diffusers may be similar to the arrangements of FIGS. 14A-14C, with the optical diffusers replacing the illustrated Fresnel lens arrays 1404a, 1404b, 1403c, 1404c. As shown in FIG. 14D, the optical diffuser may significantly widen the elevation coverage, shown by the increase in the full width at half maximum (FWHM) of the elevation beam profile 1409e' of the output beam 1409 as compared to the elevation beam profile 1409e shown in FIG. 14E. As also shown in FIG. 14D, the FWHM of the azimuth beam profile 1409a' of the output beam 1409 is relatively unchanged by the optical diffuser, shown by the similar FWHM of the azimuth beam profile 1409a in FIG. 14E.

That is, although illustrated in FIGS. 14A-14C with respect to Fresnel-type lens elements to provide vertical divergence, it will be understood that other types of lens elements may be integrated over a surface of the emitter array 300 to provide vertical beam divergence, in combination with a lens array that is configured to provide horizontal beam divergence, or alone (e.g., where the curvature of the substrate 1407 provides horizontal beam divergence). More generally, the embodiments of FIGS. 14A-14C may use any combination of curvature of the substrate 1407, primary lens elements 1403a, 1403c, and secondary lens elements 1404a, 1404b, 1404c to provide horizontal and/or vertical divergence of the output beam 1409.

Figure 15A:
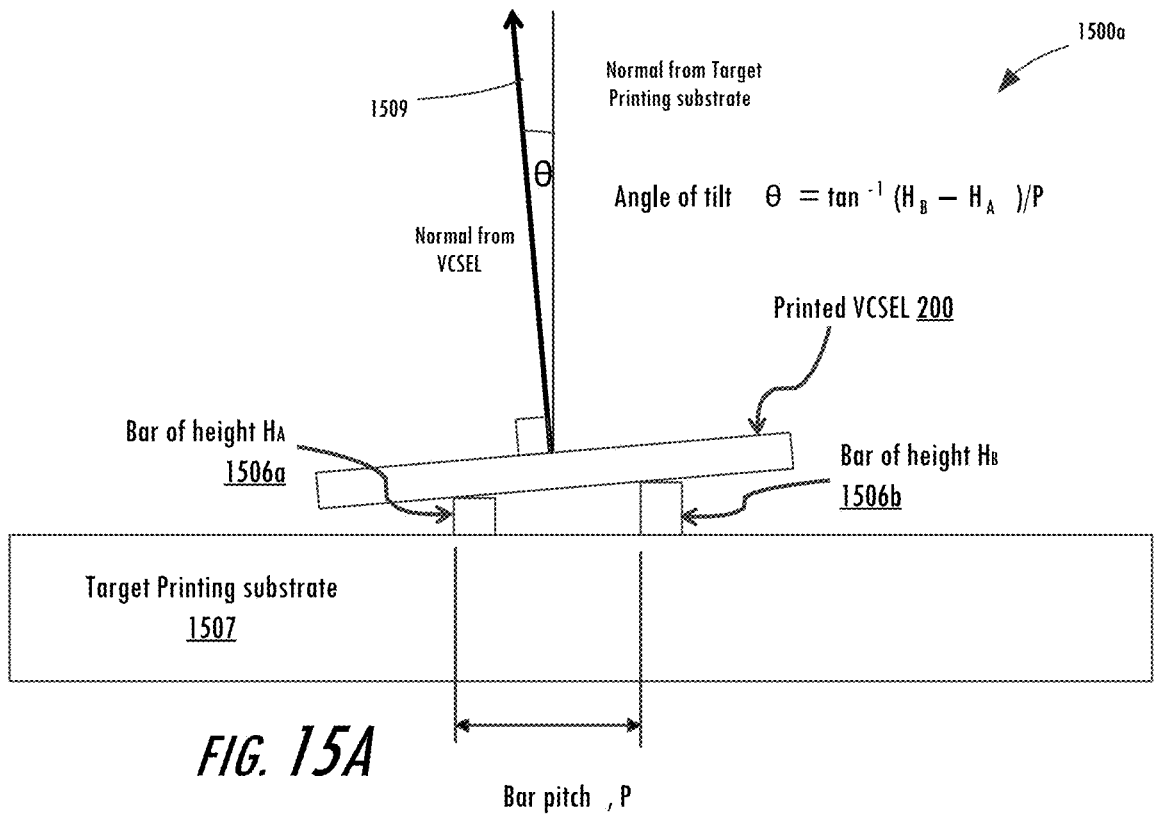
FIGS. 15A, 15B, 15C, 15E, and 15F are cross-sectional views
Figure 15B:
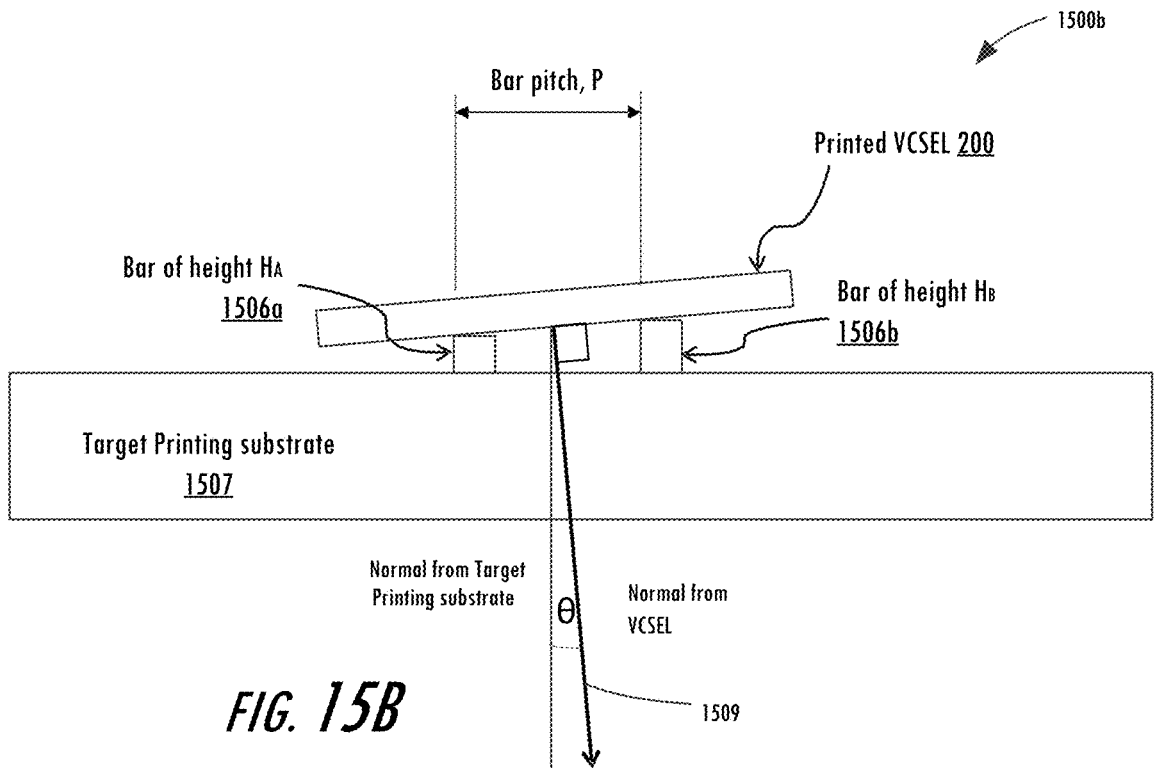

FIGS. 15A, 15B, 15C, 15E, and 15F are cross-sectional views illustrating portions of example distributed emitter arrays 1500a, 1500b, 1500c, 1500e, and 1500f including tilted laser diodes for lensless beam forming in accordance with some embodiments described herein. FIG. 15D is a plan view illustrating the portion of the array 1500c of FIG. 15C.

As shown in FIGS. 15A-15E, laser diodes (illustrated as VCSEL chiplets 200) are assembled on a rigid or flexible non-native target substrate 1507 by micro-transfer printing, electrostatic adhesion, or other mass transfer techniques. The VCSEL chiplets 200 may be electrically connected in strings to define respective rows and/or columns of emitter arrays by electrically conductive interconnects to anode and cathode contacts 211, 212 that are smaller than their respective lasing apertures 210 in at least one dimension, as shown in FIGS. 2A and 2B. The electrically conductive interconnects may be formed by patterning an electrically conductive film after providing the VCSEL chiplets 200 on the substrate 1507, for example, using conventional photolithography techniques, rather than incorporating wire bonds, ribbons, cables, or leads. In some embodiments, a stamp having a planar or a sawtooth-shaped surface may be used to pick-up the VCSEL chiplets 200 from a source substrate or wafer (e.g., in a manner similar to that shown in FIGS. 4A-4F and 4A'-4G'), and print the VCSEL chiplets 200 onto the target substrate 1507.

Figure 15C:
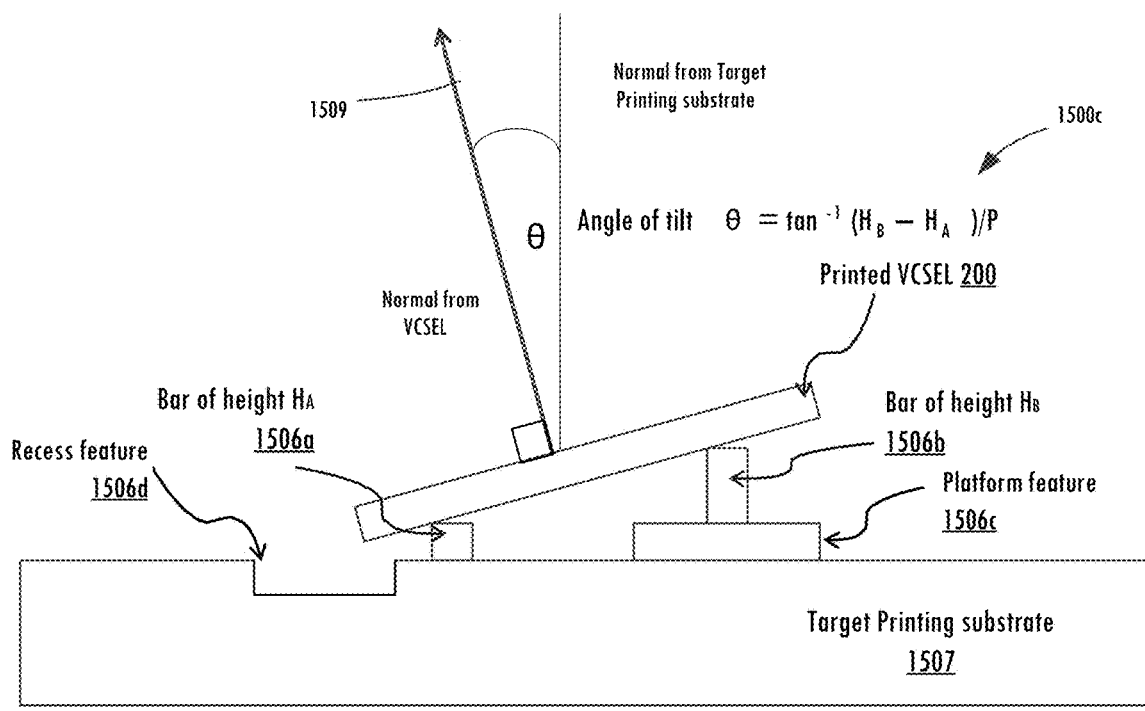
Figure 15D:
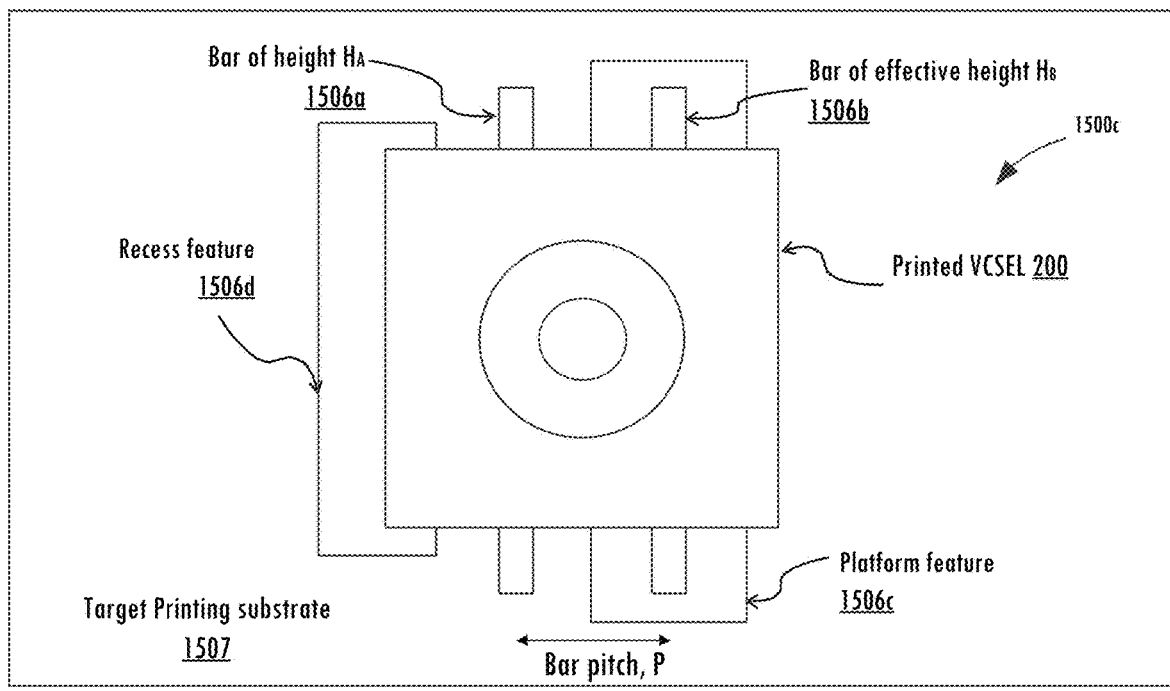
FIG. 15D is a plan view illustrating example distributed emitter arrays including tilted laser diodes for lensless beam forming in accordance with some embodiments described herein.
Figure 15E:
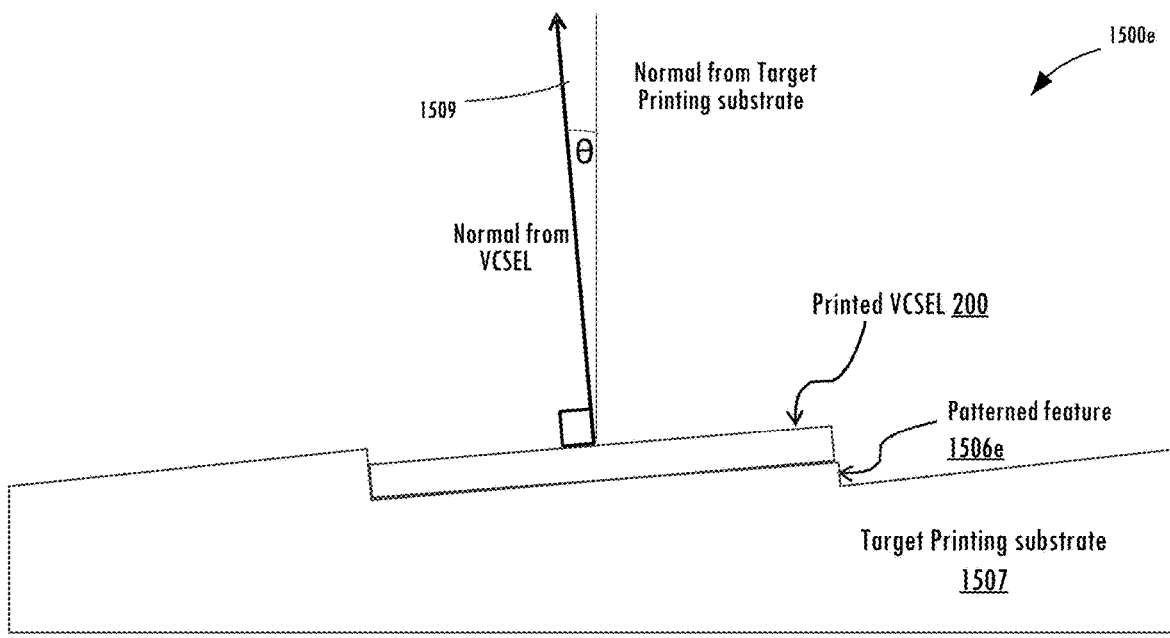

Still referring to FIGS. 15A-15E, the VCSEL chiplets 200 may be differently oriented by one or more physical features 1506a-1506e on the substrate 1507, such that the optical axes defined by their respective lasing apertures 210 have respective tilt angles θ relative to a direction that is normal to a surface of the substrate 1507. As shown in FIG. 15E, in some embodiments the substrate 1507 may include a patterned or structured surface 1506e such that the VCSEL chiplets 200 are angled to provide the respective tilt angles θ as-deposited on the surface 1506e. As shown in FIGS. 15A-15D, pairs of rail- or bar-shaped features 1506a and 1506b of different heights $H_A$ and $H_B$ may be deposited on the substrate 1507 and spaced apart at distances sufficient to angle the VCSEL chiplets 200 to provide the respective tilt angles θ when deposited thereon. An underfill material, such as an adhesive layer, may be provided between each VCSEL 200 and the underlying substrate features 1506a-1506e to improve adhesion, electrical contact, and/or pull the VCSEL 200 toward the surface of the non-native substrate 1507 in some embodiments.

The VCSEL chiplets 200 may be printed such that their respective lasing apertures 210 point away from the substrate 1507, as shown in FIGS. 15A and 15C-15E, thereby directing output beam 1509 away from the substrate 1507. Alternatively, as shown in FIG. 15B, the substrate 1507 may be transparent, and the VCSEL chiplets 200 may be printed upside-down such that their lasing apertures 210 point toward the substrate 1507, and such that the lasing aperture 210 directs light between the bar features 1506a, 1506b to provide the output beam 1509 through the substrate 1509, also referred to herein as bottom-illumination. In some bottom-illumination embodiments, the space between the VCSEL chiplets 200 and the substrate 1507 may be underfilled with a transparent material, for example silicone, to provide refractive index-matching.

In FIGS. 15A-15D, the VCSEL chiplets 200 are deposited onto the pairs of rail- or bar-shaped features 1506a and 1506b having different heights $H_A$ and $H_B$ to define the respective tilt angles (θ) relative to the surface of the substrate 1507. The tilt angles θ can be varied for each VCSEL chiplet 200 by selecting the pitch (P) and/or relative differences in height ($H_A$ and $H_B$) of the bar features 1506a and 1506b. That is, one or more pairs of bar features 1506a and 1506b may have different relative heights and/or pitches as compared to other pairs of bar features 1506a and 1506b on the same target substrate 1507. For example, as shown in FIGS. 15C and 15D, platform features 1506c can be provided between at least one of the bar features 1506a and 1506b and the surface of the substrate 1507 to increase relative height differences therebetween. In some embodiments, the bar features 1506a, 1506b may be elements of equal height, with the height difference provided by stacking bar feature 1506b on platform feature 1506c. The surface of the target substrate 1507 may be patterned or otherwise defined to include recess features 1506d, which may be sized and oriented to accommodate a lower corner of the tilted VCSELs 200. The features 1506a-1506c can be formed from conductive and/or non-conductive materials, using semiconductor processes. For example, the bar features 1506a and 1506b may be line features that are patterned in different thicknesses of metal or photoresist. In some embodiments, multiple layers of materials can be used to build-up thicknesses of bar features 1506a and 1506b. In some embodiments, the features 1506a, 1506b, 1506c may be micro-transfer printed on the surface of the substrate 1507. The VCSELs 200 that are printed or otherwise deposited onto these varying height/pitch bar feature pairs 1506a and 1506b may thus define an array of discrete VCSELs 200 with varying orientations and emission angles, providing wider fields of view/illumination.

Although discussed primarily with reference to tilt orientations to provide divergence in one dimension (for example, elevation angle/vertical divergence, with azimuth angle/horizontal divergence to be provided by curvature of a flexible substrate 1507), it will be understood that the features 1506a-1506e may be oriented at different respective angles (rather than in a grid) such that each tilted VCSEL 200 has both a horizontal divergence component and a vertical divergence component, either of which can be further increased by curvature of the substrate 1507 along a corresponding dimension.

Figure 15F:
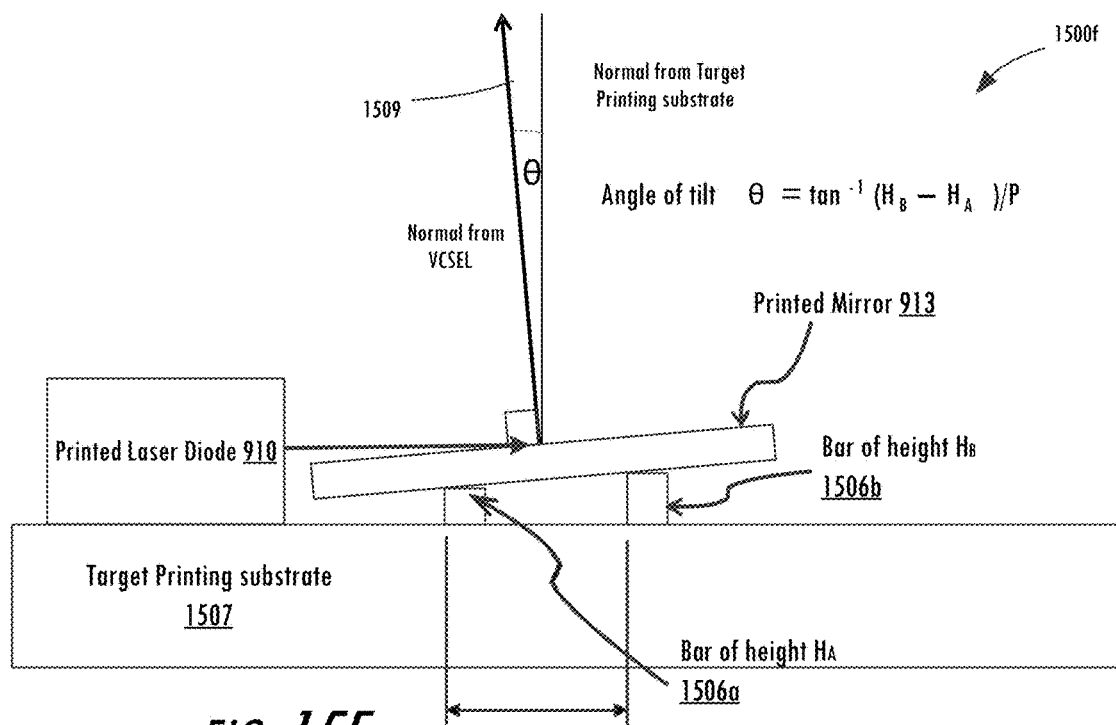

Also, although illustrated in FIGS. 15A-15E with reference to VCSEL chiplets 200, it will be understood that tilted emitter structures in accordance with embodiments described herein can be implemented using edge-emitting laser diodes 910, as shown in the example distributed emitter array 1500f of FIG. 15F. In FIG. 15F, the edge-emitting laser diode 910 is printed or otherwise deposited on a planar portion of the surface of the substrate 1507, and a micro-steering mirror structure 913 is printed or otherwise deposited on the bar features 1506a and 1506b at an angle such that the output beam 1509 is reflected to provide the respective tilt angle θ; however, it will be understood that either or both of the laser diode 910 and the mirror structure 913 may be deposited on any combination of physical features 1506a-1506e on the substrate 1507 to provide desired respective tilt angles θ.

The present invention has been described above with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element is referred to as being "on," "connected," or "coupled" to another element, it can be directly on, connected, or coupled to the other element, or intervening elements may be present. In contrast, when an element is referred to as being "directly on," "directly connected," or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments of the present invention described herein, and of the manner and process of making and using them, and shall support claims to any such combination or subcombination.

Although the invention has been described herein with reference to various embodiments, it will be appreciated that further variations and modifications may be made within the scope and spirit of the principles of the invention. Although specific terms are employed, they are used in a generic and descriptive sense only and not for purposes of limitation, the scope of embodiments of the present invention being set forth in the following claims.

The invention claimed is:

1. A laser array, comprising:
    a plurality of laser diodes arranged and electrically connected to one another on a surface of a non-native substrate, wherein respective laser diodes of the plurality of laser diodes have different orientations relative to one another, wherein the respective laser diodes are configured to provide coherent light emission in different directions, and wherein the laser array is configured to emit an output beam comprising the coherent light emission from the respective laser diodes; and
    a lens that is attached to the non-native substrate and is configured to alter a divergence of the output beam in at least one dimension, wherein the lens comprises a flexible material having a curvature corresponding to a curvature of the non-native substrate and/or corresponding to the different orientations of the respective laser diodes.

2. The laser array of claim 1, wherein the laser array comprises a LIDAR array, and wherein the output beam comprises a superposition of the coherent light emission from the multiple of the respective laser diodes that defines incoherent light having a non-uniform intensity distribution over a field of view of the laser array.

3. The laser array of claim 2, wherein the non-uniform intensity distribution is controllable responsive to a control signal to alter a curvature of a flexible substrate comprising the non-native substrate, and/or responsive to power supplied to the respective laser diodes via selective addressing.

4. The laser array of claim 1, wherein the curvature of the non-native substrate provides the different orientations of the respective laser diodes.

5. The laser array of claim 4, wherein the non-native substrate is a flexible substrate that is bent to define the curvature of the non-native substrate.

6. The laser array of claim 1, wherein the surface comprises a back surface of the non-native substrate, wherein the respective laser diodes are arranged to provide the coherent light emission through the non-native substrate, and wherein the non-native substrate comprises a material that is transparent to and is configured to at least partially collimate the coherent light emission.

7. The laser array of claim 1, wherein respective features on the surface of the non-native substrate provide the different orientations of the respective laser diodes.

8. The laser array of claim 7, wherein the respective features comprise unequal-height features and/or recesses that are sized and spaced to provide the different orientations of the respective laser diodes.

9. The laser array of claim 1, wherein the at least one dimension comprises a first direction and a second direction, wherein the lens comprises a primary lens that is configured to alter the divergence of the output beam in the first direction, and a secondary lens positioned to receive the output beam from the primary lens and alter the divergence thereof in the second direction.

10. The laser array of any of claim 9, wherein the lens comprises at least one of a Fresnel lens, a plurality of shaped lenslets, an optical diffuser, or a plurality of ball lenses.

11. The laser array of claim 10, wherein respective ball lenses of the plurality of ball lenses are suspended over respective subsets of the plurality of laser diodes, and wherein optical axes of the respective ball lenses are offset with respect to optical axes defined by respective lasing apertures of the respective subsets of the plurality of laser diodes.

12. The laser array of claim 1, wherein the respective laser diodes comprise a residual tether portion at a periphery thereof, wherein a spacing between immediately adjacent laser diodes of the plurality of laser diodes is less than about 500 micrometers.

13. The laser array of claim 1, wherein respective subsets of the plurality of laser diodes are electrically connected anode-to-cathode on the non-native substrate.

14. The laser array of claim 1, wherein the respective laser diodes are surface-emitting lasers that are separated from a native substrate thereof, wherein respective lasing apertures of the surface-emitting lasers define optical axes that are oriented in the different directions, respectively, and wherein respective electrical contacts to the surface-emitting lasers are smaller than the respective lasing apertures thereof.

15. A laser array, comprising:
a plurality of laser diodes arranged and electrically connected to one another on a surface of a non-native substrate, wherein respective laser diodes of the plurality of laser diodes have different orientations relative to one another,
wherein the respective laser diodes are configured to provide coherent light emission in different directions, and wherein the laser array is configured to emit an output beam comprising the coherent light emission from multiple of the respective laser diodes,
wherein the non-native substrate comprises a curvature that provides the different orientations of the respective laser diodes, wherein the non-native substrate is a flexible substrate that is bent to define the curvature, wherein the flexible substrate is supported by at least one mandrel element that is configured for movement in one or more directions responsive to a control signal, and wherein the movement of the at least one mandrel element alters the curvature of the flexible substrate.

16. A laser array, comprising:
a plurality of laser diodes arranged and electrically connected to one another on a surface of a non-native substrate, wherein respective laser diodes of the plurality of laser diodes have different orientations relative to one another,
wherein the respective laser diodes are configured to provide coherent light emission in different directions, and wherein the laser array is configured to emit an output beam comprising the coherent light emission from the respective laser diodes,
wherein respective features on the surface of the non-native substrate provide the different orientations of at least one of the respective laser diodes, and
wherein the respective features comprise respective patterned surfaces of the non-native substrate.

17. The laser array of claim 16, wherein the laser array is configured to emit the output beam without a refractive optical element on the plurality of laser diodes.

18. The laser array of claim 16, further comprising a lens that is attached to the non-native substrate and is configured to alter a divergence of the output beam in at least one dimension.

19. A laser array, comprising:
a plurality of laser diodes arranged and electrically connected to one another on a surface of a non-native substrate, wherein respective laser diodes of the plurality of laser diodes have different orientations relative to one another, wherein the respective laser diodes are configured to provide coherent light emission in different directions, and wherein the laser array is configured to emit an output beam comprising the coherent light emission from multiple of the respective laser diodes; and
a lens that is attached to the non-native substrate and is configured to alter a divergence of the output beam in at least one dimension,
wherein a subset of the plurality of laser diodes defines a column of the laser array, and wherein the lens comprises a respective cylindrical lens that has a specific orientation relative to the column.

* * * * *